(12) United States Patent
Nitta et al.

(10) Patent No.: US 6,307,246 B1
(45) Date of Patent: Oct. 23, 2001

(54) SEMICONDUCTOR RESURF DEVICES FORMED BY OBLIQUE TRENCH IMPLANTATION

(75) Inventors: Tetsuya Nitta; Tadaharu Minato; Akio Uenisi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/508,896

(22) PCT Filed: Jul. 23, 1998

(86) PCT No.: PCT/JP98/03289

§ 371 Date: Mar. 20, 2000

§ 102(e) Date: Mar. 20, 2000

(87) PCT Pub. No.: WO00/05767

PCT Pub. Date: Feb. 3, 2000

(51) Int. Cl.[7] .......................... H01L 23/58; H01L 21/336; H01L 29/78

(52) U.S. Cl. .......................... 257/493; 257/330; 257/401; 438/268; 438/525

(58) Field of Search .................... 438/268, 270, 438/294, 296, 299, 302, 525; 257/213, 288, 327, 328, 329, 330, 334, 335, 336, 337, 339, 365, 401, 408, 409, 476, 493, 491, 492

(56) References Cited

U.S. PATENT DOCUMENTS

| 5,045,904 | 9/1991 | Kobayashi et al. . |
|---|---|---|
| 5,216,275 | 6/1993 | Chen . |
| 5,438,215 | 8/1995 | Tihanyi . |

FOREIGN PATENT DOCUMENTS

| 2 295 052 | 5/1996 | (GB) . |
|---|---|---|
| 63-98124 | 4/1988 | (JP) . |
| 63-296282 | 12/1988 | (JP) . |
| 1-164064 | 6/1989 | (JP) . |
| 2-98175 | 4/1990 | (JP) . |
| 2-130911 | 5/1990 | (JP) . |
| 8-213617 | 8/1996 | (JP) . |
| 8-222735 | 8/1996 | (JP) . |

*Primary Examiner*—Chandra Chaudhari
*Assistant Examiner*—Evan Pert
(74) *Attorney, Agent, or Firm*—McDermott, Will & Emery

(57) ABSTRACT

A semiconductor substrate has a first main surface with a plurality of trenches 5a sandwiching a region in which p and n diffusions regions 2 and 3 are formed to provide a p-n junction along the depth of the trenches. P diffusion region 2 has a doping concentration profile provided by a p dopant diffused from a sidewall surface of one trench 5a, and n diffusion region 3 has a doping concentration profile provided by an n dopant diffused from a sidewall surface of the other trench 5a. A heavily doped n+ substrate region 1 is provided at a second main surface side of p and n diffusion regions 2 and 3. A depth Ld of trench 5a from the first main surface is greater than a depth Nd of p and n diffusion regions 2, 3 from the first main surface by at least a diffusion length L of the p dopant in p diffusion region 2 or the n dopant in n diffusion region 3 in manufacturing the semiconductor device. A high withstand voltage and low ON-resistance semiconductor device can thus be obtained.

16 Claims, 27 Drawing Sheets

FIG. 11
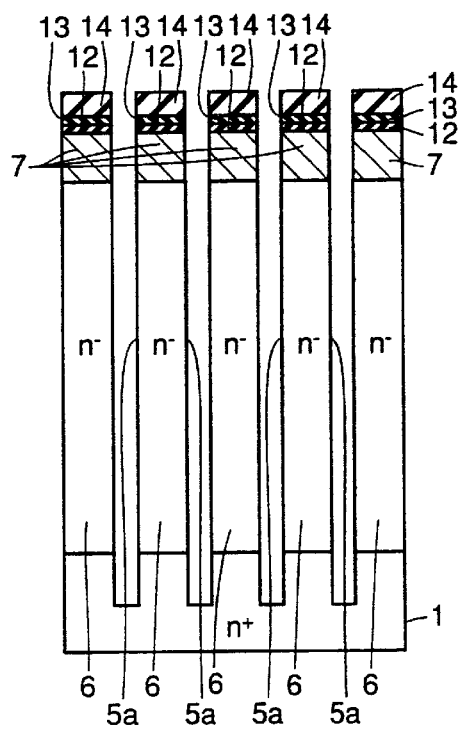
FIG. 12  BORON IMPLANTATION
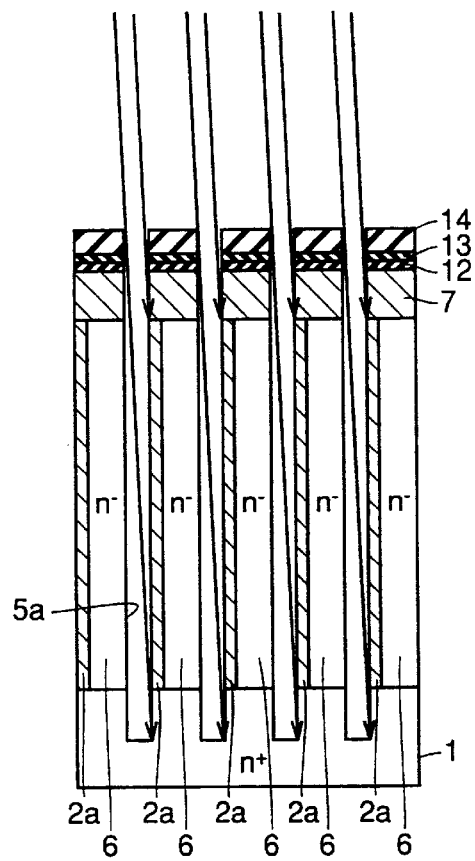

FIG.40
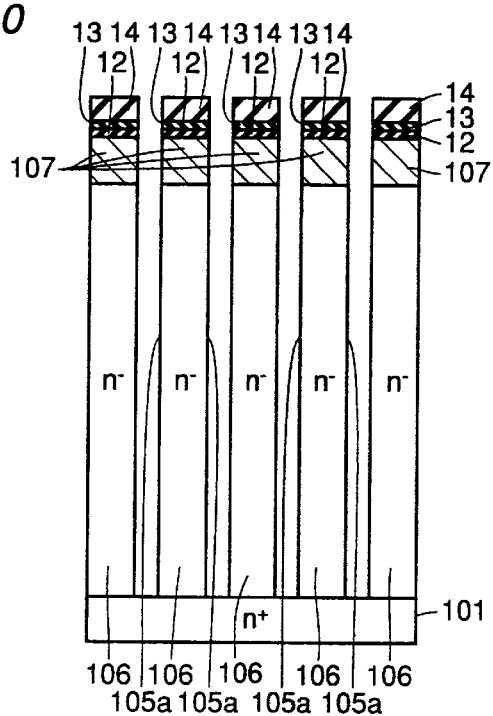
FIG.41 BORON IMPLANTATION
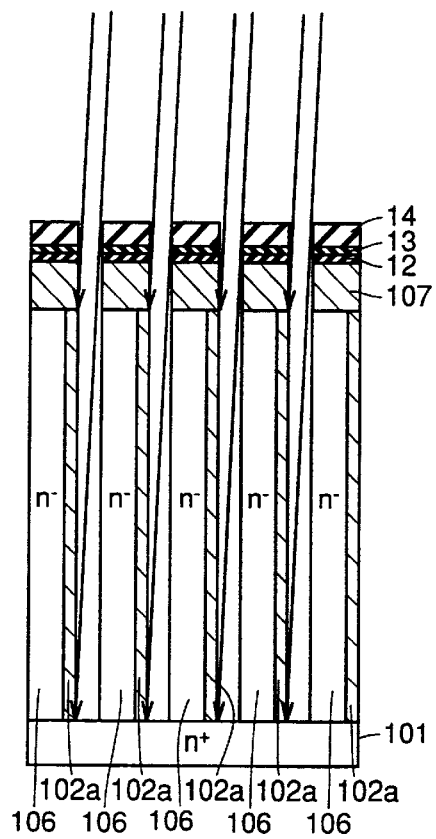

SEMICONDUCTOR RESURF DEVICES FORMED BY OBLIQUE TRENCH IMPLANTATION

TECHNICAL FIELD

The present invention relates generally to semiconductor devices and methods of manufacturing the same and in particular to a power semiconductor device used in conjunction with various-types of power supply devices which has low switching loss with low ON resistance and a method of manufacturing the same.

BACKGROUND ART

In Japanese Patent Application No. 9-26997 filed to the Japanese Patent Office on Feb. 10, 1997, the Applicant has proposed a high withstand voltage, vertical power MOSFET (Metal Oxide Semiconductor Field Effect Transistor) of the structure shown in FIG. 38.

Referring to FIG. 38, a semiconductor substrate has a first main surface with a plurality of trenches 105a repeatedly provided. In a region between trenches 105a, p- and n-type diffusion regions 102 and 103 are provided, the former provided on a sidewall surface of one trench 105a and the latter provided on a sidewall surface of the other trench 105a. P- and n-diffusion regions 102 and 103 provide a p-n junction in the direction of the depth of trench 105a (in the figure, vertically).

A p-type well (also referred to as a p-type base region) 107 is provided at p- and n-type diffusion regions 102 and 103 closer to the first main surface. An $n^+$source diffusion region 108 is provided in p-type well 107 on a sidewall surface of the other trench 105a. A gate electrode layer 110 along a sidewall surface of the other trench 105a is provided opposite to p-type well 107 sandwiched between $n^+$source diffusion region 108 and n-type diffusion region 103, with a gate insulation layer 109 posed therebetween.

Trench 105a is filled with a filler layer 105 of lightly doped silicon (including monocrystalline-, polycrystalline-, amorphous- and microcrystalline-types of silicon) or an insulator such as silicon oxide film. If filler layer 105 is lightly doped silicon, a $p^+$diffusion region 111 in contact with p-type well 107 is provided at filler layer 105 closer to the first main surface.

An $n^+$drain region 101 is provided at a second main surface side of a repetition of p- and n-type diffusion regions 102 and 103 and trench 105a (referred to as a "p-n repetition structure" hereinafter).

On the first main surface, a source electrode layer 112 is formed, electrically connected to p-type well 107, $n^+$source diffusion region 108 and $p^+$diffusion region 111. On the second main surface, a drain electrode layer 113 is formed, electrically connected to $n^+$drain region 101.

In this structure, with the device in the ON state, an n-type channel is initially induced at a surface of p-type well 107 opposite to gate electrode layer 110. Then, an electron current flows from $n^+$drain region 101 through n-type diffusion region 103, the n-type channel to $n^+$source diffusion region 108 to achieve the ON state.

In the OFF state, for a drain voltage as low as approximately 10 V, a space-charge region along a junction of an n-type region and a p-type region extends therefrom. It should be noted that the n-type region is formed of $n^+$drain region 101 and n-type diffusion region 103 that are connected to a drain and that the p-type region is formed of p-type well 107 and p-type diffusion region 102 that are connected to a source. As a drain voltage is increased, n- and p-type diffusion regions 103 and 102 are fully depleted, since regions 102 and 103 both have a reduced thickness.

If a higher drain voltage is applied, the space-charge region expands only towards p-type well 107 and $n^+$drain region 101.

Because of the p-n repetition structure, the RESURF effect can be provided in n-type diffusion region 103 to provide the present MOSFET with higher withstand voltage and lower resistance characteristics than other power MOSFETs. Thus in this structure, it is important that n- and p-type diffusion regions 103 and 102 are provided continuously with a predetermined concentration in the direction of the depth of the trenches (in the figure, vertically).

Description will now be made of a method of fabricating the p-n repetition structure of the present semiconductor device.

FIGS. 39–43 are schematic cross sections illustrating the steps of the method of manufacturing the above semiconductor device. Referring first to FIG. 39, on a heavily doped n-type substrate region 101 serving as an $n^+$drain region is provided an n- epitaxial growth layer 106 less heavily doped than heavily doped n-type substrate region 101. A conventional dopant diffusion technique is employed to provide a p-type region 107 serving as a p-type base region on a surface of n- epitaxial growth layer 106. On p-type region 107, a thermal oxide film 12, a chemical vapor deposition (CVD) silicon nitride film 13 and a CVD silicon oxide film 14 forming a 3-layered structure which serves as a mask used in anisotropically etching the underlying layers.

Referring to FIG. 40, the anisotropical etch forms a plurality of trenches 105a extending from a first main surface to reach heavily doped n-type substrate region 101.

Referring to FIG. 41, oblique ion implantation is employed to implant boron (B) into one sidewall surface of trench 105a to provide boron-implanted region 102a.

Referring to FIG. 42, oblique ion implantation with an inclination opposite to that applied in the above boron implantation is employed to implant phosphorus (P) into the other sidewall surface of trench 105a to provide a phosphorus-implanted region 103a.

Referring to FIG. 43, a CVD silicon oxide film 105 serving as an insulation film fills trench 105a and also covers 3-layered structure 12, 13, 14. Thermal treatment is then applied to diffuse the p- and n-types of dopants introduced through ion implantation. Thus n- and p-type diffusion regions 102 and 103 are provided in a region between trenches 105a to provide the p-n repetition structure.

In the FIG. 38 semiconductor device, however, the depth of p- and n-type diffusion regions 102 and 103 from the first main surface is substantially equal to that of trench 105a from the first main surface. This disadvantageously provides a low OFF-state withstand voltage and a high ON-state resistance. This disadvantage will now be detailed below.

In the above manufacturing method, ions are obliquely implanted, as shown in FIGS. 41 and 42. In this oblique ion implantation, a certain percentage of the ions are reflected at a sidewall of trench 105a, as shown in FIG. 44 (as indicated by the dotted arrows). As such, reflected ions 120 are implanted into a sidewall opposite to a targeted sidewall, i.e., a bottom of trench 105a.

In effect, trench 105a has its bottom rounded (with a definite curvature), as shown in FIG. 45. As such, ions incident directly on the bottom (indicated by the solid arrow) and those reflected at a sidewall and thus incident on the bottom (indicated by the dotted arrow) are reflected at the bottom of trench 105a and thus intensively implanted into a sidewall which is opposite to a targeted sidewall and is also a bottom of trench 105a.

As such, if p- and n-type diffusion regions 102 and 103 are substantially as deep as trench 105a, a portion with a significantly varied doping concentration (a portion with a locally varied concentration) is developed at a bottom internal to p-type diffusion region 102 and that internal to n-type diffusion region 103. Furthermore, a region with its conductivity inverted from the p- to n-type or vice versa can also be developed at bottoms internal to p- and n-type diffusion regions 102 and 103. As a result, p- and n-type diffusion regions 102 and 103 fail to have a uniform or continuous profile of doping concentration in a direction perpendicular to the first main surface. As such, when p- and n-type diffusion regions 102 and 103 are depleted in the OFF state an uneven electric field is created resulting in a reduced withstand voltage, and in the ON state an increased ON resistance is provided.

DISCLOSURE OF THE INVENTION

The present invention has been made to overcome such disadvantages, and contemplates a semiconductor device with both high withstand voltage and low ON resistance achieved by preventing a doping concentration from varying in p- and n-type diffusion regions of a p-n repetition structure, and a method of manufacturing the same.

The semiconductor device of the present invention is comprised of a semiconductor substrate, a first doped region of a first conductivity type, and a second doped region of a second conductivity type. The semiconductor substrate has a first main surface provided with a plurality of trenches, and a second main surface opposite to the first main surface. The first doped region is provided in a mesa region of the semiconductor substrate between adjacent one and other trenches of the plurality of trenches at a sidewall surface of one trench, has a doping concentration profile of a dopant of the first conductivity type diffused from a sidewall surface of one trench, and has a doping concentration lower than that of a region of the first conductivity type of the semiconductor substrate. The second doped region is provided in the mesa region at a sidewall surface of the other trench, has a doping concentration profile of a dopant of the second conductivity type diffused from a sidewall surface of the other trench, and together with the first doped region forms a p-n junction. One and the other trenches have a sidewall surface extending from the first main surface to a first depth position while maintaining a predetermined inclination with respect to the first main surface to form a first extending portion thereof. The first and second doped regions are formed shallower than the first depth position, as measured from the first main surface, by at least a length of the diffusion of the dopants of the first and second conductivity types in manufacturing the device.

In the semiconductor device of the present invention, the first and second doped regions have a depth from the first main surface less than a depth of the bottom of the first extending portion of the trench by at least the diffusion length. Thus, a portion with an uneven doping concentration that is developed by ion implantation at the bottom of the first extending portion of the trench does not distribute in the first or second doped region and is located in the semiconductor substrate at the region of the first conductivity type. Since the region of the first conductivity type of the semiconductor substrate has a doping concentration higher than that of the first doped region, the variation in the doping concentration that is caused by ion implantation in the region of the first conductivity type can be reduced to a level which does not affect the device characteristics. Furthermore, the first and second doped regions are provided with a uniform concentration that is continuous in a direction perpendicular to the first main surface. As such, even when in the OFF state a depletion layer extends over the entirety of the first and second doped regions, a uniform electric field can be built and an improved withstand voltage can be provided. Furthermore, a reduced ON-state resistance can also be provided.

The above semiconductor device is preferably also comprised of a third doped region of the second conductivity type, a fourth doped region of the first conductivity type, and a gate electrode layer. The third doped region is provided at the first main surface side of the first and second doped regions and electrically connected to the second doped region. The fourth doped region, opposite to the first doped region, with the third doped region interposed therebetween, is provided at least one of the first main surface or a sidewall surface of one trench. The gate electrode layer is opposite to the third doped region sandwiched between the first and fourth doped regions, with the gate insulation layer interposed therebetween.

Thus there can be obtained a high withstand voltage and low ON resistance MOSFET.

In the above semiconductor device preferably one and the other trenches also have a second extending portion tapering toward said second main surface, the second extending portion further extending from the first depth position towards the second main surface down to a second depth position and also having a sidewall surface having an inclination different from that of the first extending portion.

As such, if the second extending portion tapers, the first and second doped regions can be prevented from having a portion with an uneven doping concentration.

In the above semiconductor device preferably the gate electrode layer is provided in the trench.

Thus there can be provided a high withstand voltage and low ON resistance trench MOSFET.

In the above semiconductor device preferably the gate electrode layer is provided on the first main surface.

Thus there can be provided a high withstand voltage and low ON resistance planar MOSFET.

The above semiconductor device is preferably also provided with a third doped region of the second conductivity type provided at the first main surface side of the first and second doped regions and electrically connected to the second doped region.

Thus there can be provided a high withstand voltage and low ON resistance diode.

The above semiconductor device is preferably also comprised of an electrode layer in Schottky contact with the first doped region.

Thus there can be obtained a high withstand voltage and low ON resistance Schottky diode.

In the above semiconductor device preferably the length of the diffusion of the dopants of the first and second conductivity types in manufacturing the same is greater than the distance from a sidewall surface of one or the other trench to a p-n junction of the first and second doped regions.

As such, a portion with an uneven doping concentration that is developed in a vicinity of a bottom of the first extending portion of a trench does not diffuse to the first or second doped region when thermal treatment is applied in manufacturing the device.

A method of manufacturing the semiconductor device in accordance with the present invention is comprised of the following steps:

Initially, a semiconductor substrate is formed which has first and second main surfaces opposite to each other, has a heavily doped region of a first conductivity type at the second main surface and also has a lightly doped region of the first conductivity type at the first main surface side. The semiconductor substrate is provided with a plurality of trenches having a first extending portion having a sidewall surface with a predetermined inclination relative to a first main surface while extending from the first main surface through the heavily doped region down to a first depth position therein. Then, a dopant of the first conductivity type is implanted obliquely into a mesa region of the semiconductor substrate between adjacent one and other trenches of the plurality of trenches at a sidewall surface of one trench to provide at the sidewall surface of one trench a first doped region of the first conductivity type having a doping concentration lower than that of the heavily doped region. Then a dopant of a second conductivity type is implanted obliquely into the mesa region at a sidewall surface of the other trench to provide at the sidewall surface of the other trench a second doped region of the second conductivity type providing a p-n junction of the first and second doped regions. The first depth position is closer to the second main surface than a junction of the heavily and lightly doped regions is by at least the length of the diffusion of the dopants of the first and second conductivity types in manufacturing the semiconductor device. The dopants of the first and second conductivity types are both implanted at an angle to introduce the dopants of the first and second conductivity types directly to a depth closer to the second main surface than the junction of the heavily and lightly doped regions by at least the length of the diffusion of the dopants of the first and second conductivity types in manufacturing the semiconductor device.

Since in the method of manufacturing the semiconductor device of the present invention the first and second doped regions are shallower than a bottom of the first extending portion of a trench by at least a diffusion length, a portion with an uneven doping concentration that is developed at the bottom of the first extending portion of the trench through ion implantation does not distribute into the first or second doped region and is located in the semiconductor substrate at a region of the first conductivity type. Since the region of the first conductivity type of the semiconductor substrate has a doping concentration higher than that of the first doped region, the variation in the doping concentration that is caused by ion implantation in the region of the first conductivity type can be reduced to a level which does not affect the device characteristics. Furthermore, the first and second doped regions are provided with a uniform concentration that is continuous in a direction perpendicular to the first main surface. As such, even if in the OFF state a depletion layer extends to the first and second doped regions, a uniform electric field can be built and an enhanced withstand voltage can be provided. Furthermore, a reduced, ON-state resistance can also be provided.

In the method of manufacturing the semiconductor device preferably the plurality of trenches also have a second extending portion tapering toward said second main surface, the second extending portion further extending from the first depth position towards the second main surface down to a second depth position and having a sidewall surface with an inclination different from that of the first extending portion. As such, if the second extending portion, e.g., tapers the first and second doped regions can be prevented from having a portion with an uneven doping concentration.

The method of manufacturing the semiconductor device is preferably comprised of the steps of: forming at the first main surface side of the first and second doped regions a third doped region of the second conductivity type electrically connected to the second doped region; forming at at least one of the main surface or a sidewall surface of one trench a fourth doped region of the first conductivity type opposite to the first doped region with the third doped region interposed therebetween; and forming a gate electrode layer opposite to the third doped region sandwiched between the first and fourth doped regions, with a gate insulating layer interposed therebetween.

Thus there can be fabricated a high withstand voltage and low ON-resistance MOSFET.

In the method of manufacturing the semiconductor device preferably the gate electrode layer is provided in the trench.

Thus there can be manufactured a high withstand voltage and low ON-resistance trench MOSFET.

In the method of manufacturing the semiconductor device preferably the gate electrode layer is provided on the first main surface.

Thus there can be fabricated a high withstand voltage and low ON-resistance planar MOSFET.

The method of manufacturing the semiconductor device is preferably also comprised of the step of forming at the first main surface side of the first and second doped regions a third doped region of the second conductivity type electrically connected to the second doped region.

Thus there can be fabricated a high withstand voltage and low ON-resistance diode.

The method of manufacturing the semiconductor device is preferably also comprised of the step of forming an electrode layer in Schottky contact with the first doped region.

Thus there can be fabricated a high withstand voltage and low ON-resistance Schottky diode.

In the method of manufacturing the semiconductor device preferably the length of the diffusion of the dopants of the first and second conductivity types in manufacturing the same is greater than the distance from a sidewall surface of one or the other trench to a p-n junction of the first and second doped regions.

As such, a portion with an uneven doping concentration that is developed in a vicinity of a bottom of the first extending portion of a trench does not diffuse to the first or second doped region when thermal treatment is applied in manufacturing semiconductor device.

BRIEF DESCRIPTION OF DRAWINGS

FIGS. 9 through 22 are schematic cross sections illustrating the steps of a method of manufacturing a semiconductor device according to the seventh embodiment of the present invention.

FIGS. 39 through 43 are schematic cross section illustrating the steps of a method of manufacturing the FIG. 38 MOSFET.

BEST MODES FOR CARRYING OUT THE INVENTION

The embodiments of the present invention will now be described with reference to the drawings.

First Embodiment

Figure 1:
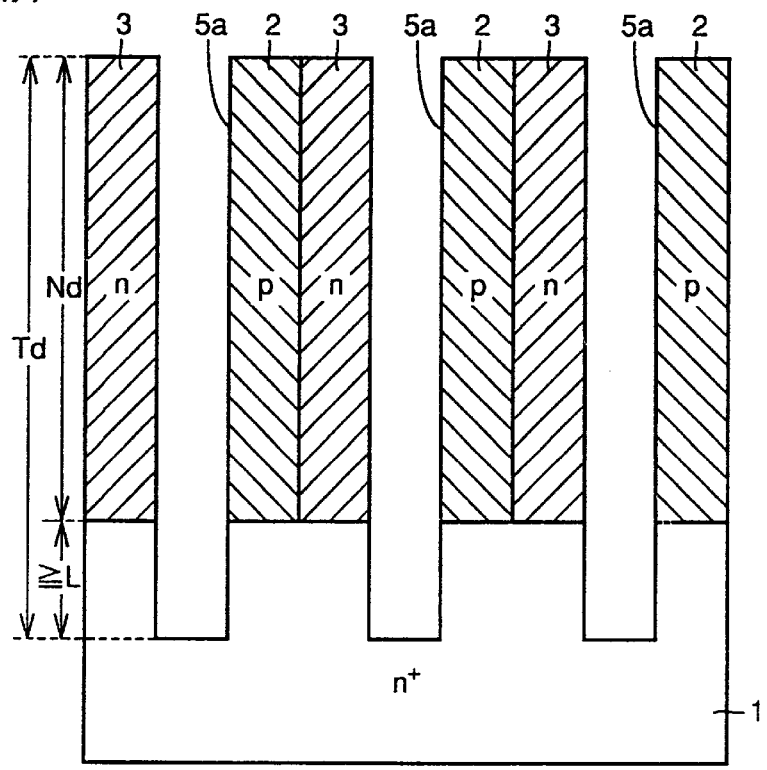
FIG. 1 is a cross section schematically showing a configuration of a semiconductor device of a first embodiment of the present invention.

Referring to FIG. 1, a semiconductor substrate has a first main surface provided with a plurality of trenches 5a. In a region between trenches 5a are p and n diffusion regions 2 and 3. P diffusion region 2 is provided at a sidewall surface of one trench 5a and n diffusion region 3 at a sidewall surface of the other trench 5a. P diffusion region 2 has a doping concentration profile resulting from a p dopant diffused from the sidewall surface of one trench 5a, and n diffusion region 3 has a doping concentration profile resulting from an n dopant diffused from the sidewall surface of the other trench 5a. P and n diffusion regions 2 and 3 form a p-n junction in the direction of the depth of trench 5a.

A heavily doped n substrate region 1 is formed adjacent to the repetition formed by p and n diffusion regions 2 and 3 and trench 5a (a p-n repetition structure) and closer to the second main surface than the p-n repetition structure.

A depth Td of trench 5a from the first main surface is greater than a depth Nd of p and n diffusion regions 2 and 3 from the first main surface by at least a diffusion length L. Diffusion length L represents the total length of the diffusion of the p dopant in p diffusion region 2 or the n dopant in n diffusion region 3 through all thermal treatments applied in manufacturing the semiconductor device.

In the present application, diffusion length L represents "a depth (or a length) at which a doping concentration is one tenth of a surface concentration when a dopant introduced into a surface is diffused due to thermal treatment." Thus, with a dopant diffusion coefficient D, $$\text{diffusion length } L = (\log e 10)^{1/2} \times 2 \times (D \times s)^{1/2}$$

wherein s represents a diffusion time in seconds.

A description will now be made with respect to a specific value of diffusion length L when boron and phosphorus are used for forming p and n diffusion regions 2 and 3, respectively.

For a device with a spacing of 2 $\mu$m between trenches 5a, phosphorus and boron are each implanted into a sidewall of trench 5a and four thermal treatments are then mainly required, as described in Table 1.

TABLE 1

| | Thermal Treatment Temperature | Thermal Treatment Time |
|---|---|---|
| 1. Diffusion of ions implanted into sidewall | 1100° C. | 1 hour |
| 2. Filling of trench | 850° C. | 1 hour |
| 3. Formation of gate oxide film | 850° C. | 30 minutes |
| 4. Formation of interlayer film | 850° C. | 90 minutes |

Boron and phosphorus have their respective diffusion coefficients Ds, as provided in Table 2.

TABLE 2

| | 850° C. | 1100° C. |
|---|---|---|
| Boron | 1e-15 cm$^2$/sec | 3.5e-13 cm$^2$/sec |
| Phosphorus | 1e-15 cm$^2$/sec | 3.5e-13 cm$^2$/sec |

When the values provided in Tables 1 and 2 are used to calculate the boron's diffusion length L (boron), $$L \text{ (boron)} = (\log e\, 10)^{1/2} \times 2 \times (3.5e-13 \times 3600)^{1/2} +$$
$$(1e-15 \times 10800)^{1/2})$$
$$= (\log e\, 10)^{1/2} \times 2 \times (3.5e-5 + 0.32e-5) \text{ (cm)}$$
$$= 1.2\ \mu m$$

Since boron and phosphorus have substantially the same diffusion coefficient, as provided in Table 2, diffusion length L is 1.2 μm for both of boron and phosphorus.

As such, in FIG. 1, depth Td of trench 5a must be greater than depth Nd of p and n diffusion regions 2 and 3 by at least 1.2 μm.

As is apparent from the Table of diffusion coefficients, diffusion length L is in effect often determined depending on thermal treatment of as high a temperature as no less than 950° C.

In contrast, for a thermal treatment flow of a high temperature, (e.g., no less than 1000° C.), increasing and decreasing the temperature of the device can result in a thermal treatment which is too significant to ignore. For example, an excessive thermal treatment of approximately 30(=150°C./5°C./min.) minutes is applied if a temperature of 950° C. is increased to a temperature of 1100° C. or 1100° C. is decreased to 950° C. at a rate of 5° C./min. If it is approximated to the intermediate temperature (1025° C.), such thermal treatment results in a longer diffusion length L as represented below:

$$\text{diffusion length} = (\log e 10)^{1/2} \times 2 \times (5e-14 \times 1800)^{1/2} = 0.3\ \mu m.$$

As such, depth Td of trench 5a needs a depth which is estimated deeper by 0.3 μm.

Exemplary diffusion lengths L when trenches 5a have spacings of 3 μm and 5 μm therebetween are provided as below.

With trenches 5a having a spacing of 3 μm therebetween, the aforementioned diffusion of ions implanted into a sidewall is provided at approximately 1100° C. for approximately two hours. Since the conditions for the subsequent thermal treatments are not changed, $$\text{diffusion length } L = (\log e 10)^{1/2} \times 2 \times ((3.5e-13 \times 7200)^{1/2} + (1e-15 \times 10800)^{1/2}) = 1.6\ \mu m.$$

With trenches 5a having as large a spacing as 5 μm therebetween, a significant thermal treatment is applied to diffuse ions at a sidewall. Thus, base diffusion must be provided after sidewall diffusion. As such, the diffusion of ions implanted into a sidewall is provided at 1000° C. for 5 hours and base diffusion is provided at 1100° C. for one hour, and the conditions for the subsequent thermal treatments are not changed. Therefore $$\text{diffusion length } L = (\log e 10)^{1/2} \times 2 \times ((3.5e-13 \times 21600)^{1/2} + (1e-15 \times 10800)^{1/2}) = 2.8\ \mu m.$$

Description will now be made of a method of manufacturing a semiconductor device in the present embodiment.

Figure 2:
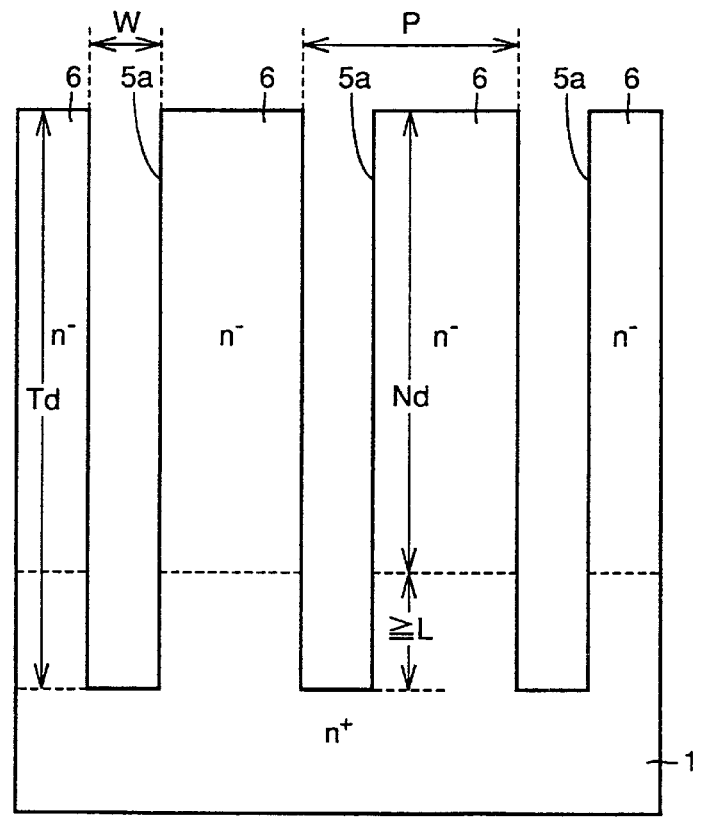
FIG. 2 illustrates a step of a method of manufacturing a semiconductor device according to the first embodiment of the present invention.

Referring to FIG. 2, on heavily doped n substrate region 1 an n⁻doped layer 6, lightly doped with an n⁻dopant at a sufficiently low doping concentration, is, e.g., epitaxially grown. Then a predetermined pattern is formed on the first main surface and used as a mask to anisotropically etch the underlying layers to form a plurality of trenches 5a. Depth Td of trench 5a from the first main surface is greater than depth Nd of n⁻doped layer 6 from the first main surface by at least diffusion length L.

Then, boron and phosphorus are each implanted into a sidewall of trench 5a to form p and n diffusion regions 2 and 3, as shown in FIG. 1, to complete a p-n repetition structure.

Depth Nd of n⁻doped layer 6 is defined as below.

In the present application, depth Nd of n⁻doped layer 6 is the depth of n⁻doped layer 6 immediately before the implantation of the dopants for p and n diffusion regions 2 and 3 of the p-n repetition structure. In other words, n⁻doped layer 6 is formed, e.g., through epitaxial growth, as has been described above, and when the epitaxial growth thereof is completed the resultant epitaxial layer has approximately the same thickness as n⁻doped layer 6.

Figure 39:
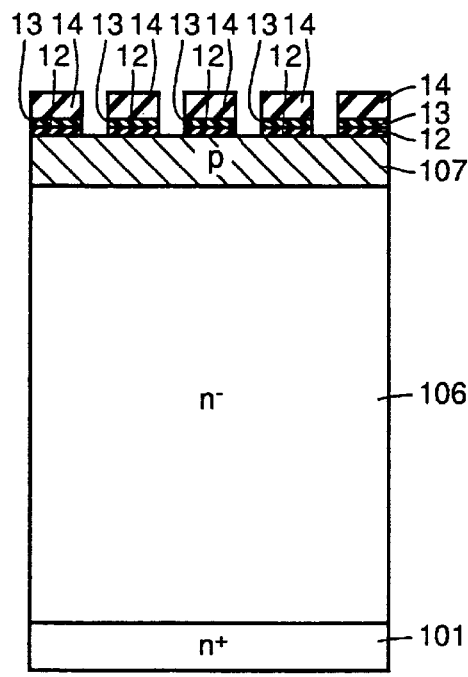
Figure 42:
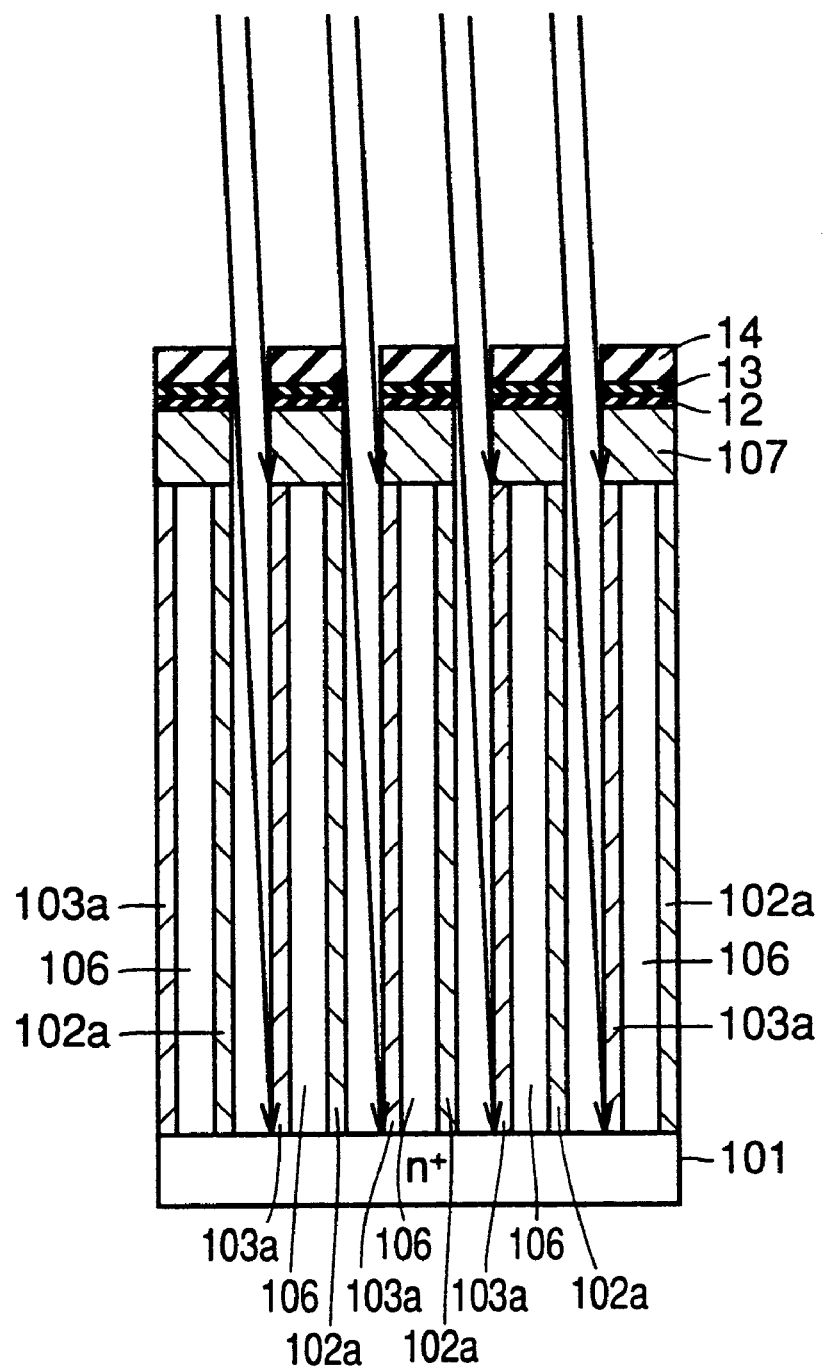
Figure 43:
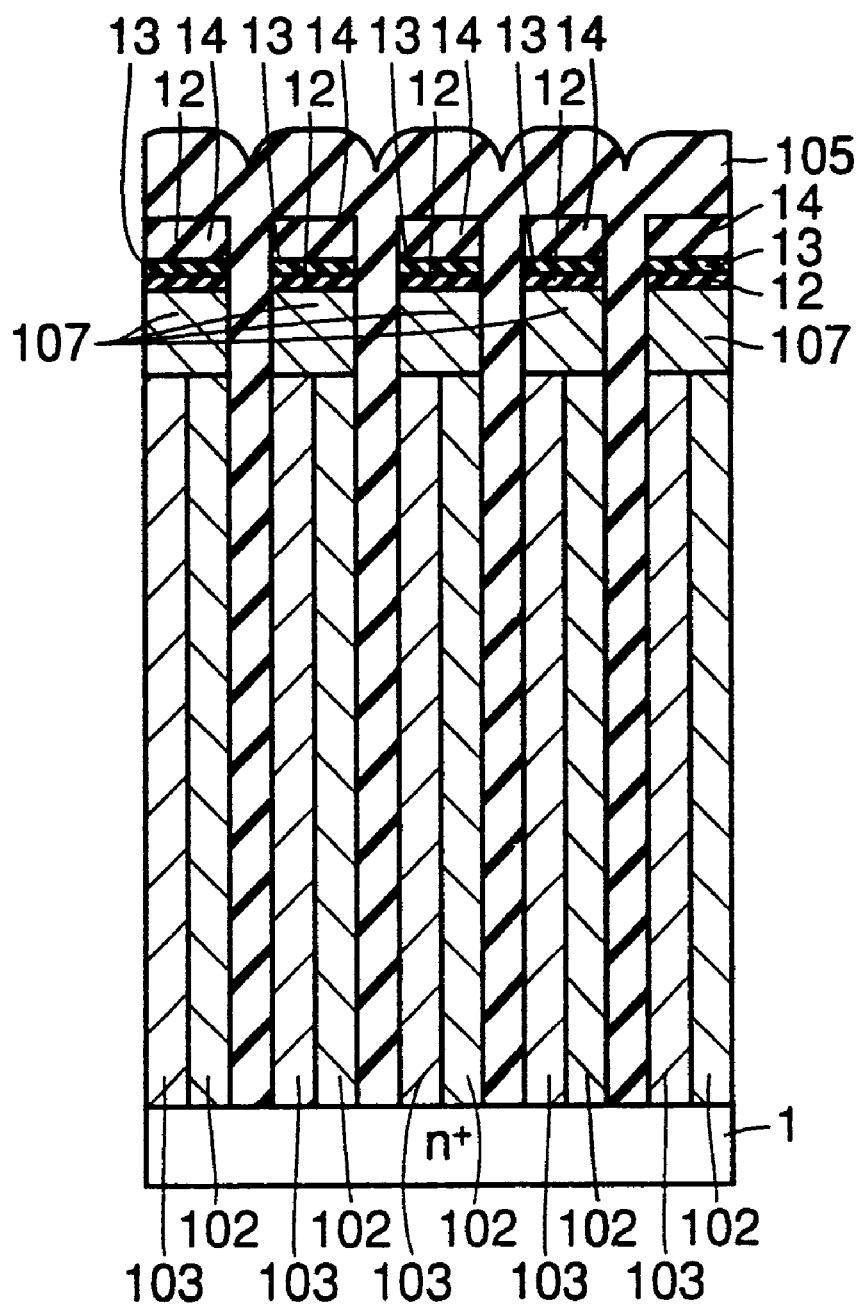
Figure 44:
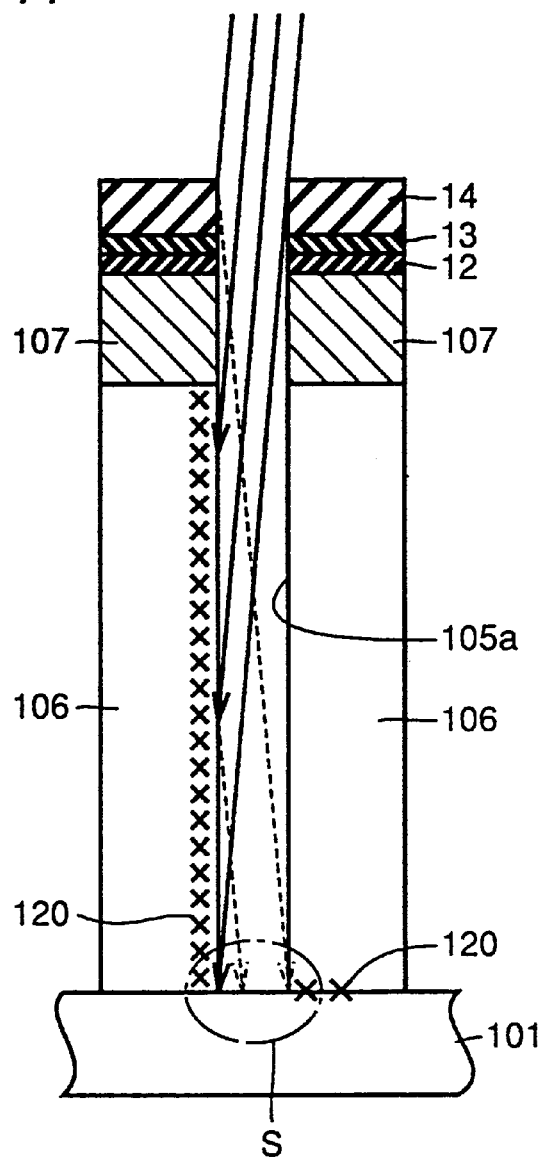
FIG. 44 is a schematic cross section illustrating that a dopant is implanted into a trench's sidewall opposite to a targeted sidewall to be doped with the dopant.
Figure 45:
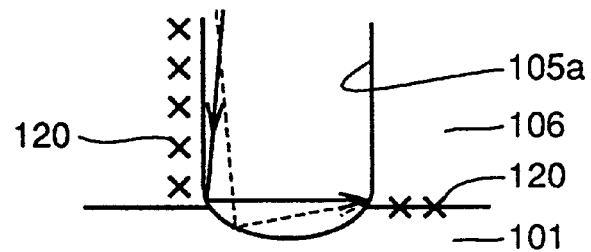
FIG. 45 is an enlarged view of a region S of FIG. 44.

The implantation of the dopants for forming p and n diffusion regions 2 and 3 to provide the p-n repetition structure can, however, be preceded by a thermal treatment. For example, although it is not shown in FIG. 2, a known dopant diffusion technique may be employed to form a p diffusion region serving as a p base region at n⁻doped layer 6 closer the first main surface, as has been described with reference to FIG. 39. This requires a thermal treatment for base diffusion. The thermal treatment diffuses the n dopant of a high concentration from heavily doped n substrate region 1 into the epitaxial layer and thus reduces the thickness of n⁻doped layer 6.

Since the thickness of n⁻doped layer 6 varies depending on whether a thermal treatment is applied before the ion implantation for forming p and n diffusion regions 2 and 3, the present application defines depth Nd of n⁻doped layer 6 as the depth of n⁻doped layer 6 immediately before the aforementioned dopant implantation.

In the present embodiment, p and n diffusion regions 2 and 3 are shallower than a bottom surface of trench 5a by at least diffusion length L. As such, a portion with an uneven doping concentration that is developed in a vicinity of the trench 5a bottom surface is not located internal to p or n diffusion region 2 or 3 and is located internal to heavily doped n substrate region 1, nor is the portion with the uneven doping concentration diffused by a thermal treatment in the fabrication process into or distributed in p or n diffusion region 2 or 3. Since heavily doped n substrate region 1 has a doping concentration sufficiently higher than n diffusion region 3, the uneven doping concentration in heavily doped n substrate region 1 can be so reduced that it does not affect the device characteristics. Furthermore, p and n diffusion regions 2 and 3 may have a predetermined concentration which is continuous in a direction perpendicular to the first main surface. As such, even if in the OFF state a depletion layer extends across the entirety of p and n diffusion regions 2 and 3, a uniform electric field can be built and an enhanced withstand voltage can be achieved. Furthermore, a reduced, ON-state resistance can also be provided.

Second Embodiment

The present embodiment provides a structure including a trench having a sidewall of an inclination relative to the first main surface that may vary with its depth.

Figure 3:
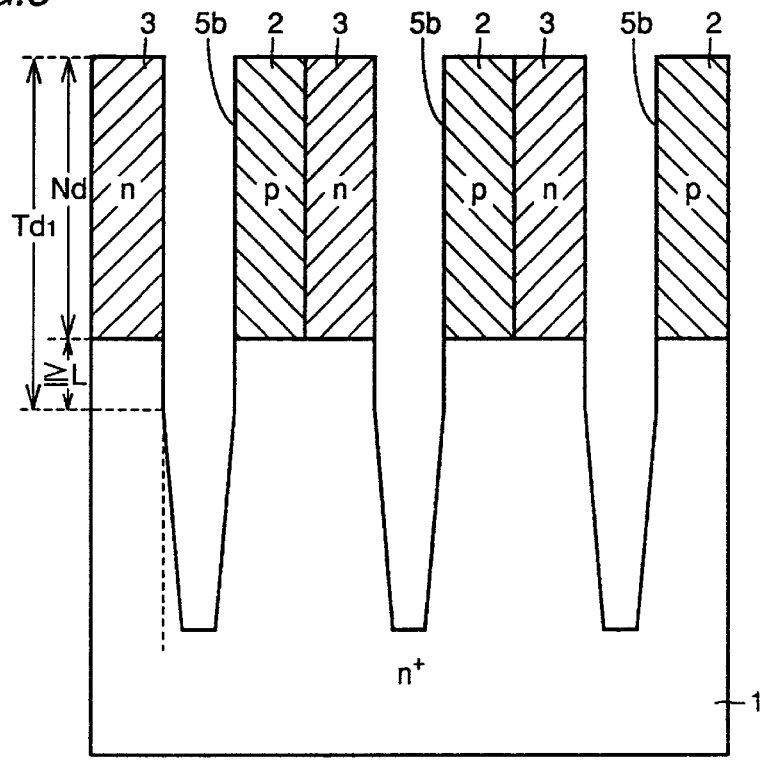
FIG. 3 is a cross section schematically showing a structure of a semiconductor device of a second embodiment of the present invention.

Referring to FIG. 3, trench 5b has a first extending portion having a sidewall extending substantially perpendicular, e.g., to the first main surface, and a second extending portion extending from the first extending portion and having a sidewall tapering toward the second main surface. A depth $Td_1$ of the first extending portion is greater than depth Nd of p and n diffusion regions 2 and 3 of the repetition structure by at least diffusion length L.

Except the above structure, the present embodiment has substantially the same structure as shown in FIG. 1. Thus, identical members are denoted by same reference characters and a description thereof will not be repeated.

Figure 4:
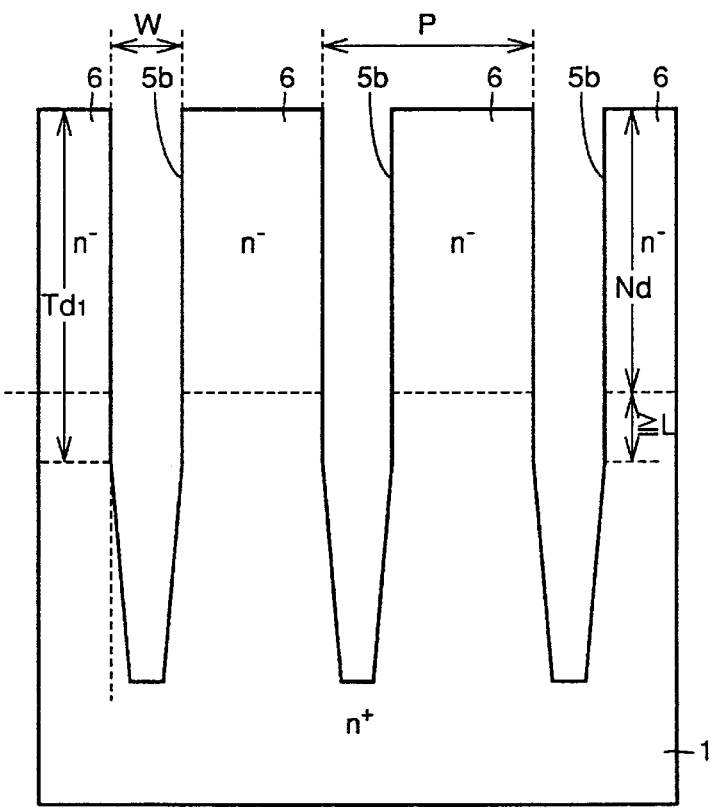
FIG. 4 illustrates a step of a method of manufacturing a semiconductor device according to the second embodiment of the present invention.

In the manufacturing method of the present embodiment, as shown in FIG. 4, trench 5b is provided with depth $Td_1$ of the first extending portion greater than depth Nd of n⁻doped layer 6 by at least diffusion length L.

Except the above, the manufacturing process is substantially the same as in the first embodiment and a description thereof will not be repeated.

In the second extending portion (the tapered portion) with a varied inclination the ions implanted are reflected from a sidewall at an angle different than in the first extending portion. Thus in the second extending portion not only a bottom surface thereof but also the entire side wall surface thereof can disadvantageously reflect a dopant, which can then disadvantageously be introduced into the opposite sidewall surface. In other words, the second extending portion can disadvantageously have a doping concentration that locally varies along the entirety of its sidewall surface.

Accordingly, depth $Td_1$ of the first extending portion of trench 5b is adapted to be greater than depth Nd of p and n diffusion regions 2 and 3 of the p-n repetition structure by at least diffusion length L. As such, if the second extending portion has a doping concentration locally varying along the entirety of its sidewall surface, p and n diffusion regions 2 and 3 can be free of such local variation in doping concentration. Thus, as in the first embodiment, p and n diffusion regions 2 and 3 can be provided with a uniform concentration that is continuous in a direction perpendicular to the first main surface. As such, if in the OFF state a depletion layer extends across the entirety of p and n diffusion regions 2 and 3, a uniform electric field can be built and an enhanced withstand voltage can be provided. Furthermore, a reduced, ON-state resistance can also be provided.

Third Embodiment

The present embodiment will be described with respect to a dopant implantation angle for forming p and n diffusion regions 2 and 3 with a uniform concentration which is continuous in a direction perpendicular to the first main surface.

Figure 5:
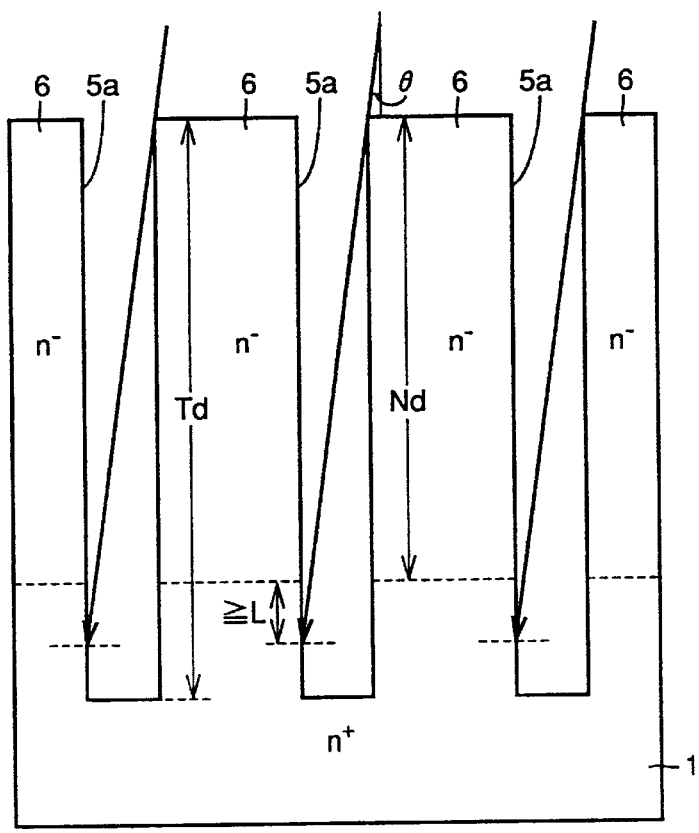
FIG. 5 illustrates a step of a method of manufacturing a semiconductor device according to a third embodiment of the present invention.

Referring to FIG. 5, p or n dopant ions must be implanted at an angle which allows the ions to be introduced directly to a location deeper than thickness Nd of n⁻doped layer 6 by at least diffusion length L.

As such, a portion with a concentration locally varied is developed in a vicinity of a location deeper than n⁻doped layer 6 by at least diffusion length L. As such, when p and n diffusion regions 2 and 3 of the p-n repetition structure is subsequently formed, the portion with a concentration locally varied is not located internal to p or n diffusion region 2 or 3. By defining a dopant ion implantation angle relative to thickness (or depth) Nd of n⁻doped layer 6 rather than the depth of trench 5a, p and n diffusion regions 2 and 3 can be provided with a uniform concentration which is continuous in the direction of the depth.

Fourth Embodiment

The present embodiment will be described with respect to specific values of various portions for the device with a withstand voltage of 300V.

Referring to FIG. 2, for a device with a desired withstand voltage of 300V, n⁻doped layer 6 is only required to have a doping concentration of approximately 1e13cm⁻³ and a thickness Nd of approximately 17 μm. As has been described in the first embodiment, n⁻doped layer 6 is not the exact, lightly doped layer epitaxially grown but a layer having a lower doping concentration than heavily doped n substrate region 1 immediately before the implantation of the dopants for forming p and n diffusion regions 2 and 3 forming the p-n repetition structure. Thus, thickness Nd of n⁻doped layer 6 varies depending on whether base diffusion or the like is provided before the dopant implantation.

A pitch P applied to repeat p and n diffusion regions 2 and 3 in the lateral direction is desirably at most 3 to 5 μm to prevent an uneven electric field in the lateral direction. In order to provide a sufficiently reduced ON resistance, it is better to provide a larger ratio of n diffusion region 3 and a width W of trench 5a is desirably at most 1 to 1.5 μm. Thus, p and n diffusion regions 2 and 3 each have a width of approximately 1 to 2 μm.

a more specific description will now be made for a trench 5a width W of 1 μm, a lateral repeating pitch P of 3 μm, and a 2 μm distance between trenches 5a.

Diffusion length L of p and n diffusion regions 2 and 3 must be diffused from a sidewall surface of trench 5a to a center of the region between trenches 5a and L is thus required to be larger than 0.5×2 μm. Furthermore, L is also required to be smaller than approximately 0.7×2 μm, since the p-n repetition structure cannot be provided if diffusion length L is completely diffused between trenches 5a. That is, a thermal treatment must be applied to provide L which is approximately larger than 1 μm and smaller than 1.4 μm. It is needless to say that in forming a base after the formation of p and n diffusion regions 2 and 3, a thermal treatment including that for base diffusion must be applied to provide L approximately larger than 1 μm and smaller than 1.4 μm.

With trench 5a having a sidewall extending substantially perpendicular to the first main surface, as shown in FIG. 2, trench 5a requires a depth Td of 17 μm+L=18 to 18.4 μm or more.

With trench 5a having a sidewall with an inclination varying with its depth, as shown in FIG. 4, depth $Td_1$ corresponding to a location at which the inclination varies (i.e., the bottom of the first extending portion) must be greater than 18 to 18.4 μm.

In the oblique dopant implantation for forming p and n diffusion regions 2 and 3, ions must be introduced directly into a location deeper than n⁻doped layer 6 by at least diffusion length L, as shown in FIG. 5. Thus, when L=1 μm, ions must be implanted at an acute angle θ of no less than $\tan^{-1}(1/(17+1))=3.2°$ relative to the direction perpendicular to the first main surface.

Fifth Embodiment

Similar to the fourth embodiment, for a device with a withstand voltage of 50V, n⁻doped layer 6 is only required to have a doping concentration of approximately 1e13 cm⁻³ and a thickness Nd of approximately 4 μm. Desirably, width W of trench 5a is at most 0.5 μm and pitch P applied to repeat p and n diffusion regions 2 and 3 in the lateral direction is approximately 1.5 μm. Thus, diffusion length L of p and n diffusion regions 2 and 3 is approximately 0.5 to 0.7 μm. Thus, with a trench formed substantially perpendicular to the first main surface, as shown in FIG. 1, trench 5a requires a depth Ld ($Ld_1$ in FIG. 2) of 4.5 to 4.7 μm or more.

Sixth Embodiment

Similar to the fourth embodiment, for a device with a withstand voltage of 1000V, n⁻doped layer 6 is only required to have a doping concentration of approximately 1e13 cm⁻³ and a thickness Nd of approximately 50 μm. To avoid an uneven lateral electric field, as a small lateral repeating pitch P as possible is desired, desirably a structure with approximately no more than 10 μm for the withstand voltage of 1000V. Thus, diffusion length is approximately 3 to 5 μm. With a trench formed substantially perpendicular to the first main surface, as shown in FIG. 1, trench 5a requires a depth Ld (Ld1 in FIG. 2) of 53 to 55 µm or more.

Seventh Embodiment

The present embodiment will be described with respect to a trench MOSFET.

Figure 6:
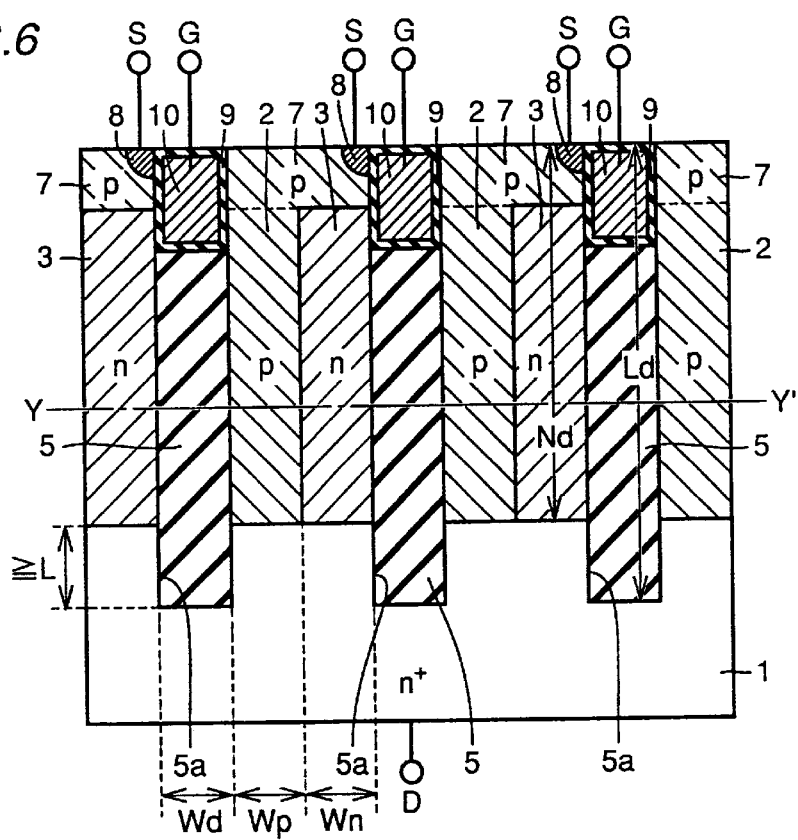
FIG. 6 is a cross section schematically showing a structure of a semiconductor device of a seventh embodiment of the present invention.

Referring to FIG. 6, a semiconductor substrate has a first main surface provided with a plurality of repeated trenches 5a. In a region between trenches 5a are provided p and n diffusion regions 2 and 3. P diffusion region 2 is provided at a sidewall surface of one trench 5a and n diffusion region 3 at a sidewall surface of the other trench 5a. P and n diffusion regions 2 and 3 form a p-n junction in the direction of the depth of trench 5a.

A p well (also referred to as a p base region) is provided at the first main surface side of n and p diffusion regions 2 and 3. A source $n^+$ diffusion region 8 is provided internal to p well 7 at a sidewall surface of the other trench 5a. A gate electrode 10 along a sidewall surface of the other trench 5a is provided opposite to p well 7 sandwiched between source $n^+$ diffusion region 8 and n diffusion region 3, with gate insulation layer 9 interposed therebetween.

Trench 5a is filled with a filler layer 5 of silicon of a low doping concentration (including monocrystalline-, polycrystalline-, amorphous- and microcrystalline-types of silicon) or an insulator such as silicon oxide film.

A drain $n^+$ region 1 having a much higher concentration than n diffusion region 3 is provided adjacent to the p-n repetition structure and closer to the second main surface than the p-n repetition structure.

P diffusion region has a doping concentration profile resulting from a p dopant diffused from a sidewall surface of one trench 5a, and n diffusion region 3 has a doping concentration profile resulting from an n dopant diffused from a sidewall surface of the other trench 5a.

Figure 7:
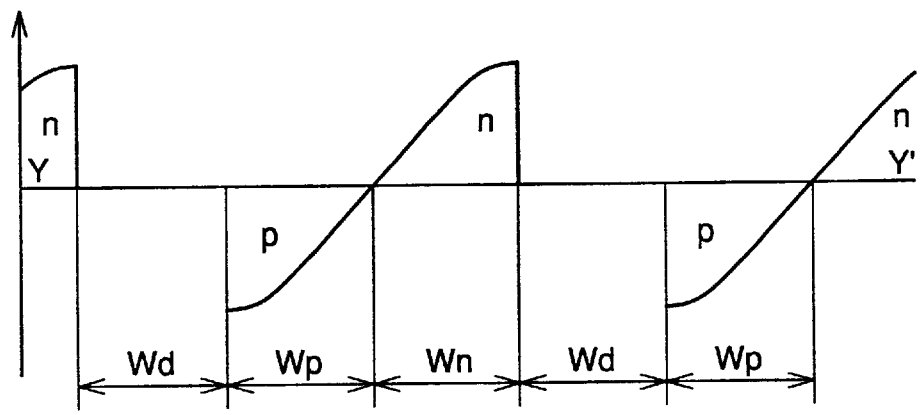
FIG. 7 represents a net doping concentration along line Y–Y' of FIG. 6.
Figure 8:
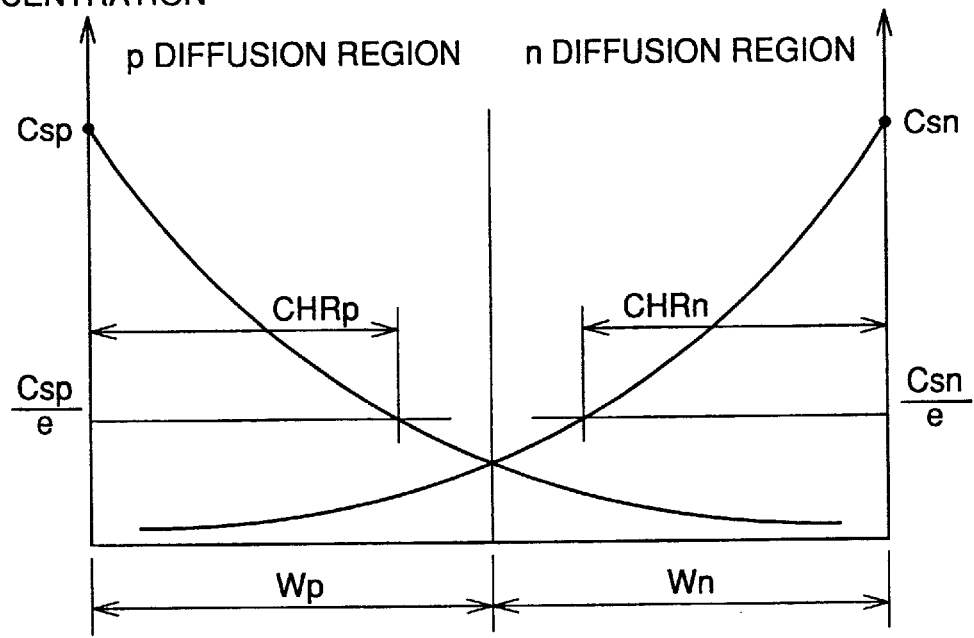
FIG. 8 represents a doping concentration of a p-type diffusion region and that of an n-type diffusion region.

Thus, a net doping concentration at the cross section along line Y–Y' of FIG. 6 is as shown in FIG. 7. In the figure, since a dopant is introduced from trench 5a the concentration of the dopant is high at a sidewall surface of trench 5a and is reduced as the dopant enter further into the silicon. As it is thermally diffused, the dopant distributes substantially according to the Gaussian distribution, as shown in FIG. 8. A doping concentration profile is determined by defining surface doping concentrations Csn and an Csp and diffusion lengths CHRn and CHRp as parameters. As such, a p-n junction formed by p and n diffusion regions 2 and 3 is provided at a location allowing the dopants from the both to diffuse at the same concentration.

Referring to FIG. 6, depth Ld of trench 5a from the first main surface is greater than depth Nd of the p-n repetition structure from the first main surface by at least diffusion length L of the p dopant in p diffusion region 2 or the n dopant in n diffusion region 3 in manufacturing the semiconductor device.

A manufacturing method in the present embodiment will now be described.

Figure 9:
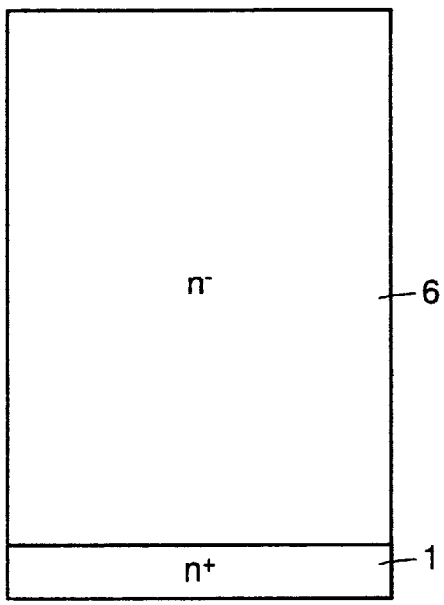

Referring to FIG. 9, on heavily doped n substrate region 1 serving as a drain $n^+$ region is $n^-$ doped layer 6 formed e.g., through epitaxial growth and having a doping concentration sufficiently lower than a that in a dopant diffusion step described hereinafter. Alternatively, $n^-$ doped layer 6 may be provided by directly sticking a substrate of an approximately equal doping concentration and polishing it to a desired thickness.

Figure 10:
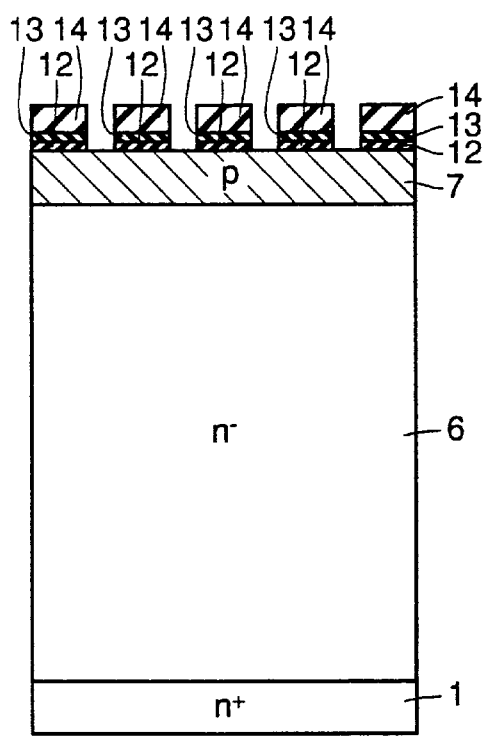

Referring to FIG. 10, a known dopant diffusion technique is employed to provide on a surface of $n^-$ doped layer 6 a p region 7 serving as a p base region of a MOSFET. On p region 7 are provided a thermal oxide film 12, a CVD silicon nitride film 13 and a CVD silicon oxide film 14 that are stacked to provide a 3-layered structure having a desired form. The layered structure formed by stacked layers 12, 13, 14 is used as a mask to anisotropically etch the underlying layers.

Referring to FIG. 11, the anisotropical etch provides a trench 5a penetrating p region 7 and $n^-$ doped layer 6 and reaching heavily doped n substrate region 1. It should be noted that the depth of trench 5a from the first main surface is greater than the depth of $n^-$ doped layer 6 from the first main surface by at least diffusion length L of a p- or n-dopant subsequently implanted into a sidewall of trench 5a in manufacturing the device.

Since the anisotropical silicon etching step requires an anti-etching film for a mesa, an anti-silicon-etching film such as CVD silicon oxide film 14 is previously formed and a photolithography step and an etching step are then typically applied to provide a pattern. As has been described above, since the width, aspect ratio and the like of trench 5a must be provided with high precision, dry etch is employed using a fluoride gas, such as $NF_3$, $SF_6$, $SiF_4$.

During the dry etch, a thin film, normally referred to as a deposition film, having a composition dose to that of silicon oxide film, is formed at a sidewall of trench 5a. Accordingly, immediately after the anisotropical silicon etch the deposition film is removed by a chemical of hydrofluoric-acid (HF)-type.

Referring to FIG. 12, oblique ion implantation is employed to implant boron (B) into one sidewall surface of trench 5a to provide a boron doped region 2a.

Figure 13:
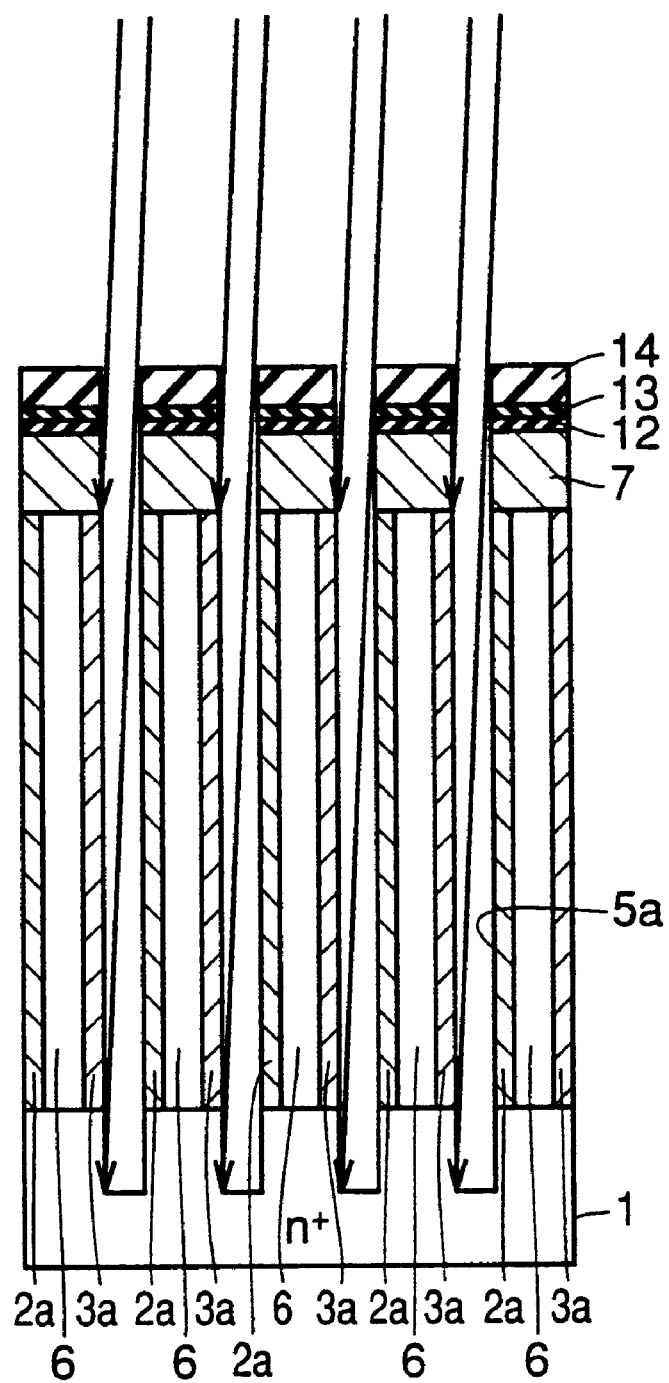

Referring to FIG. 13, oblique ion implantation opposite in inclination to the boron implantation is employed to implant phosphorus (P) into the other sidewall surface of trench 5a to provide a phosphorus doped region 3a.

Figure 14:
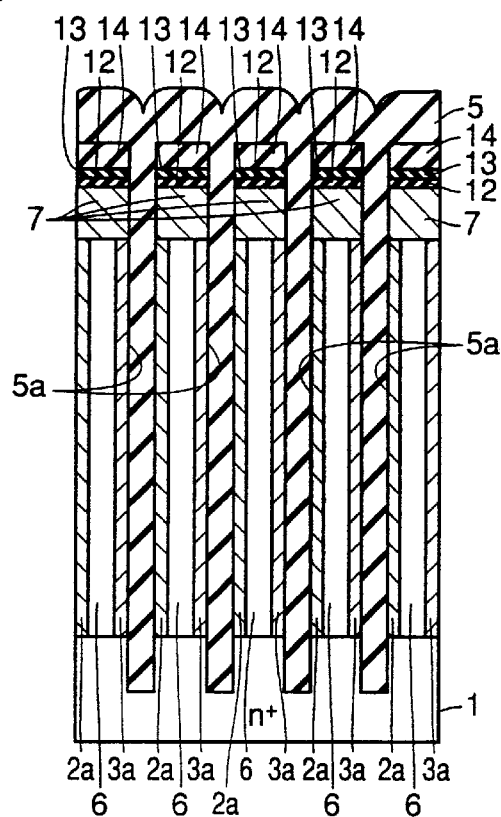

Referring to FIG. 14, regions 2a and 3a are simultaneously subjected to a thermal treatment to allow the profile of the p and n dopants introduced through ion implantation to approach to a required, targeted diffusion profile.

In this thermal treatment, trench 5a is filled with an insulator or CVD silicon oxide film 5 promptly after the ion implantation in order to prevent the atoms with ions implanted from diffusing from a sidewall surface of trench 5a outwards into the atmosphere. Filling trench 5a as promptly as possible also prevents dust in the atmosphere during the manufacturing process from entering trench 5a.

If trench 5a is filled with silicon as a semi-insulation film, a thermal treatment is initially applied, with the aforementioned CVD silicon oxide film replaced with a thin, thermal oxide film. Then, dry etch or the like is employed to remove at least the oxide film on the bottom surface of trench 5a and chemical vapor deposition or the like is then applied to fill trench 5a with silicon of the aforementioned various types.

Figure 15:
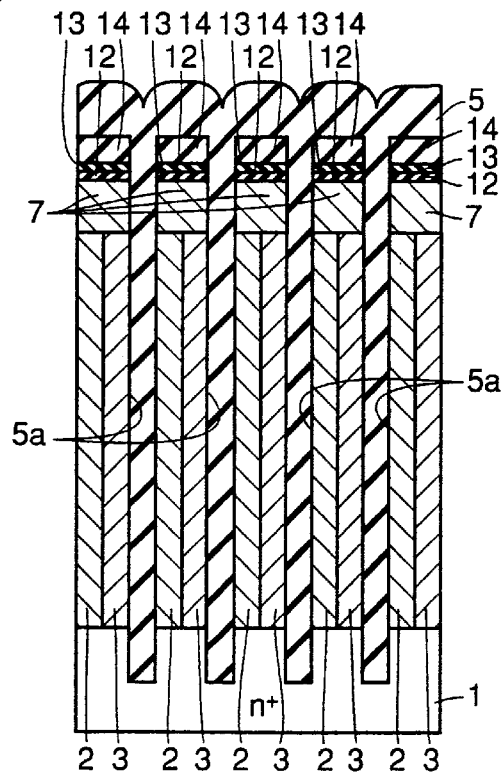

Referring to FIG. 15, a thermal treatment is provided to diffuse the p and n dopants introduced through ion implantation, to form p and n diffusion regions 2 and 3 in a region between trenches 5a. Insulation film 5 is subjected to a film retreating step through entire-surface etching, i.e., etched back.

Figure 16:
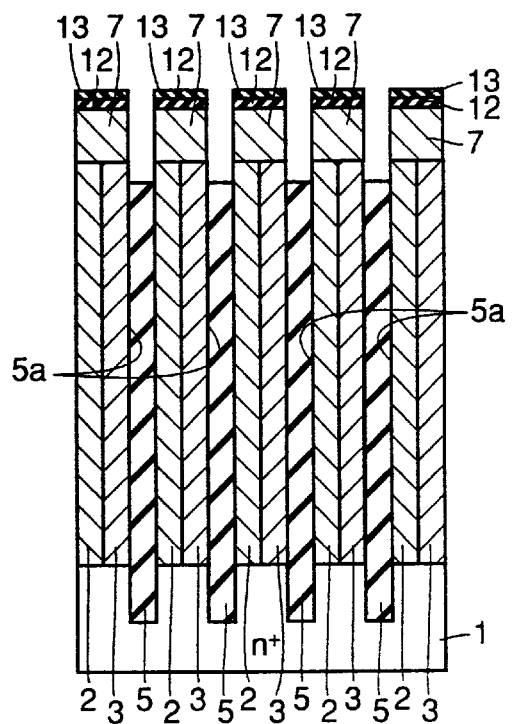

Referring to FIG. 16, p base region 7 thus has a side surface exposed at a sidewall surface of trench 5a. It should be noted that in removing insulation film 5, the uppermost layer of the 3-layered structure, i.e., CVD silicon oxide film 14 is removed.

Insulation film 5 may be etched back through either dry etching or wet etching, although in general it is desirably etched back through dry etching to process it with high precision.

Figure 17:
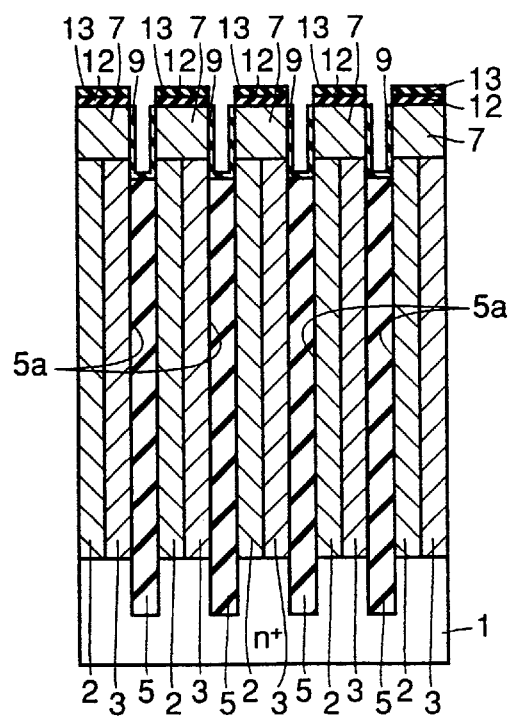

Referring to FIG. 17, thermal oxidation or the like is then employed to form a gate insulation layer 9 of silicon oxide film on the silicon exposed at a sidewall surface of trench 5a.

Figure 18:
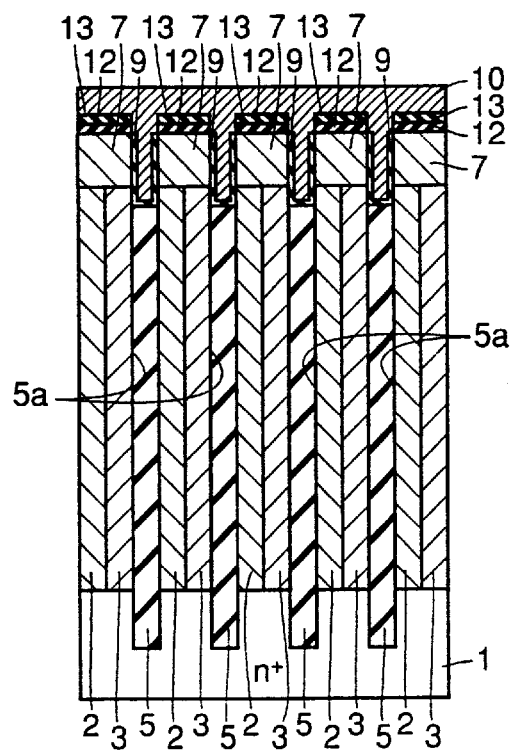

Referring to FIG. 18, to fill an upper portion of trench 5a and also cover CVD silicon nitride film 13, a polycrystalline silicon film doped with a dopant (a doped polysilicon film) 10 is formed through chemical vapor deposition. Doped silicon film 10 is etched back.

Figure 19:
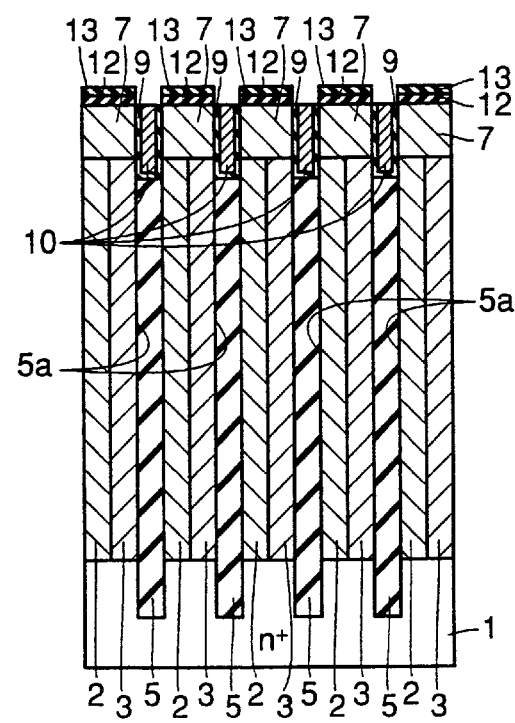

Referring to FIG. 19, a gate electrode layer 10 is thus formed at a side surface of p base region 7 with gate insulation layer 9 interposed therebetween. Then CVD silicon nitride film 13 and thermal oxide film 12 are removed successively.

Figure 20:
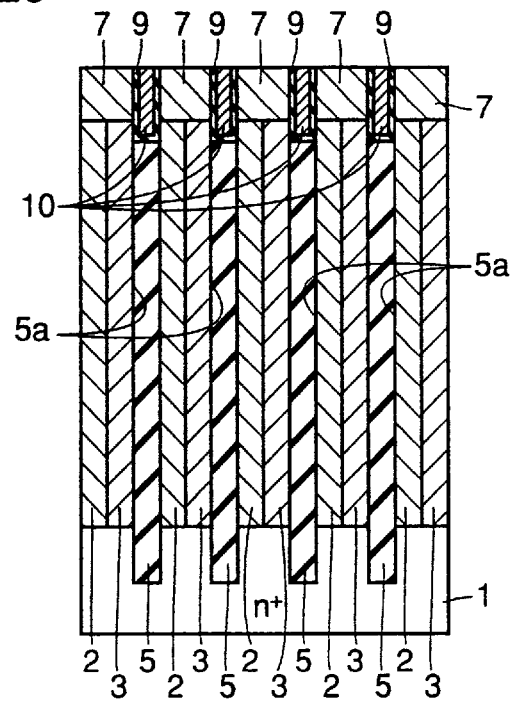

Referring to FIG. 20, p base region 7 thus has an upper surface exposed.

Figure 21:
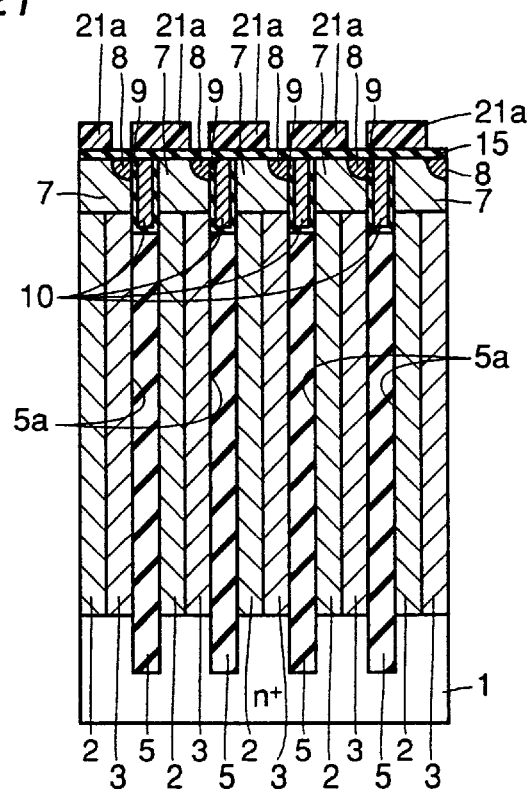

Referring to FIG. 21, thermal oxidation is employed to form a cap oxide film 15 on exposed p base region 7 and filled trench 5a. Typical photolithography is employed to form a resist pattern 21a of a desired pattern on cap oxide film 15. With resist pattern 21a used as a mask, ion implantation is provided to form source n+diffusion region 8 in p base region 7. After resist pattern 21a is removed, typical photolithography and etching technique are employed to selectively remove cap oxide film 15 only on p base region 7.

Figure 22:
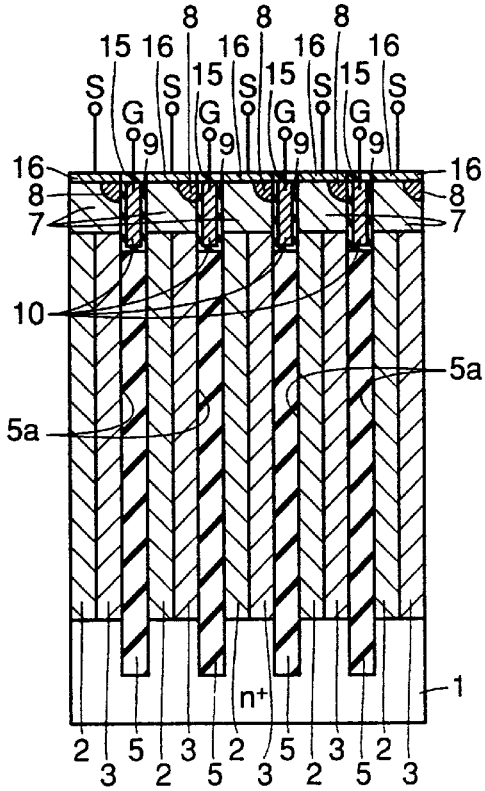

Referring to FIG. 22, a source electrode layer 16 is formed in contact with an exposed surface of p base region 7.

Thus a trench MOSFET completes.

Figure 23:
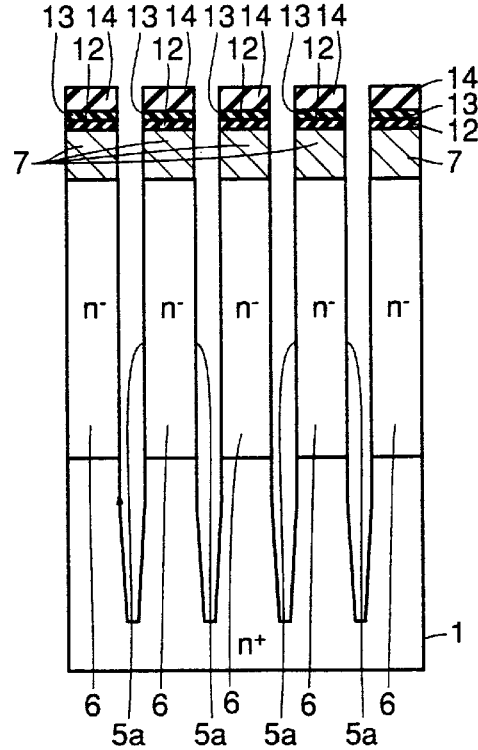
FIG. 23 illustrates a step when a trench has a tapered bottom.

While in the above method, trench 5a has a sidewall extending substantially perpendicular to the first main surface of the semiconductor substrate, as shown in FIG. 11, a trench may be similar to trench 5b shown in FIG. 23, having a sidewall with a varied inclination, although the depth at which the sidewall of trench 5b has the varied inclination (i.e., the depth of the first extending portion) must be greater than the depth of n⁻doped layer 6 by at least diffusion length L, at has been described in the second embodiment.

Figure 24:
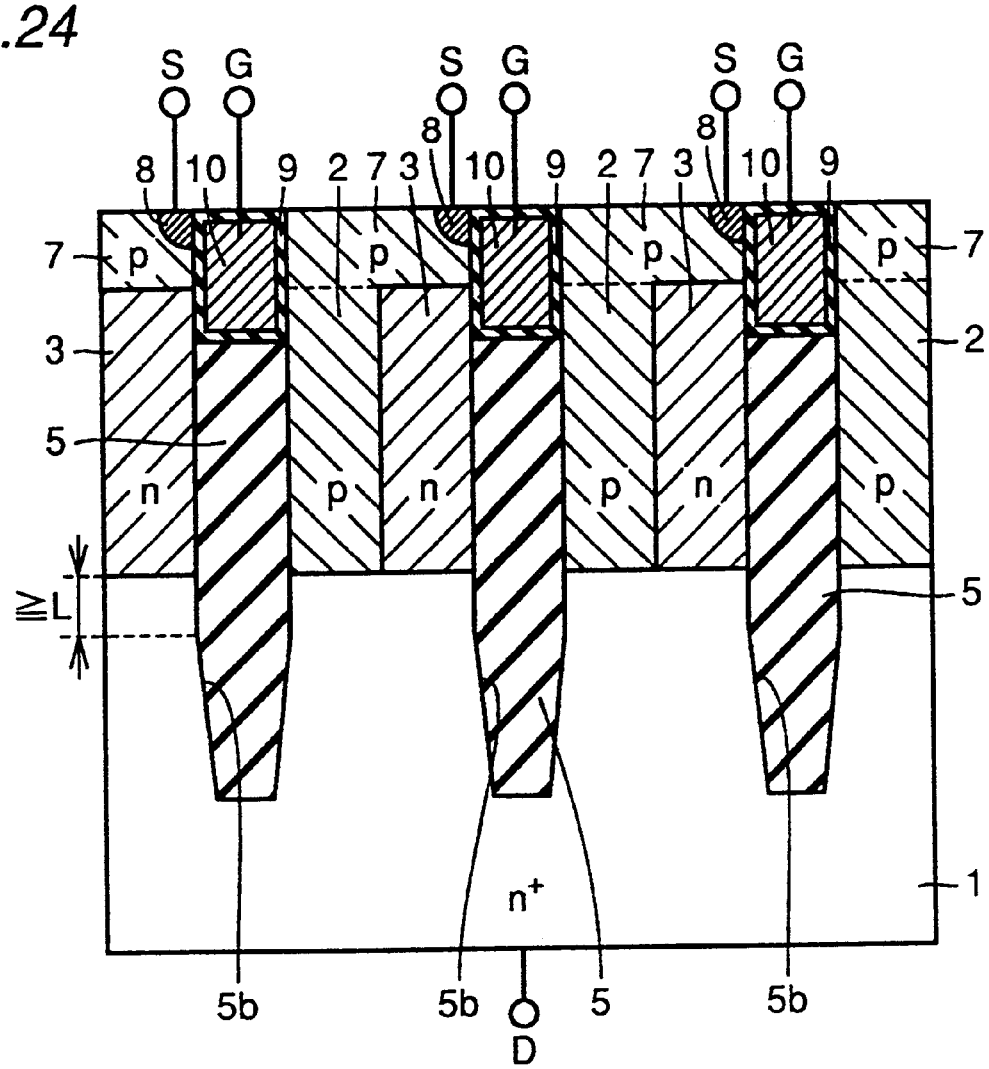
FIG. 24 is a schematic cross section of a structure of a semiconductor device of the seventh embodiment of the present invention with a trench having a tapered bottom.

Thus the completed trench MOSFET has the structure as shown in FIG. 24.

The FIG. 24 structure is substantially the same as the FIG. 6 structure, except that trench 5b has a sidewall with an inclination varying with its depth and that the depth at which the inclination varies is greater than the depth of p and n diffusion regions 2 and 3 by at least diffusion length L. As such, identical members are denoted by the same reference characters and a description thereof will not be repeated.

Figure 25:
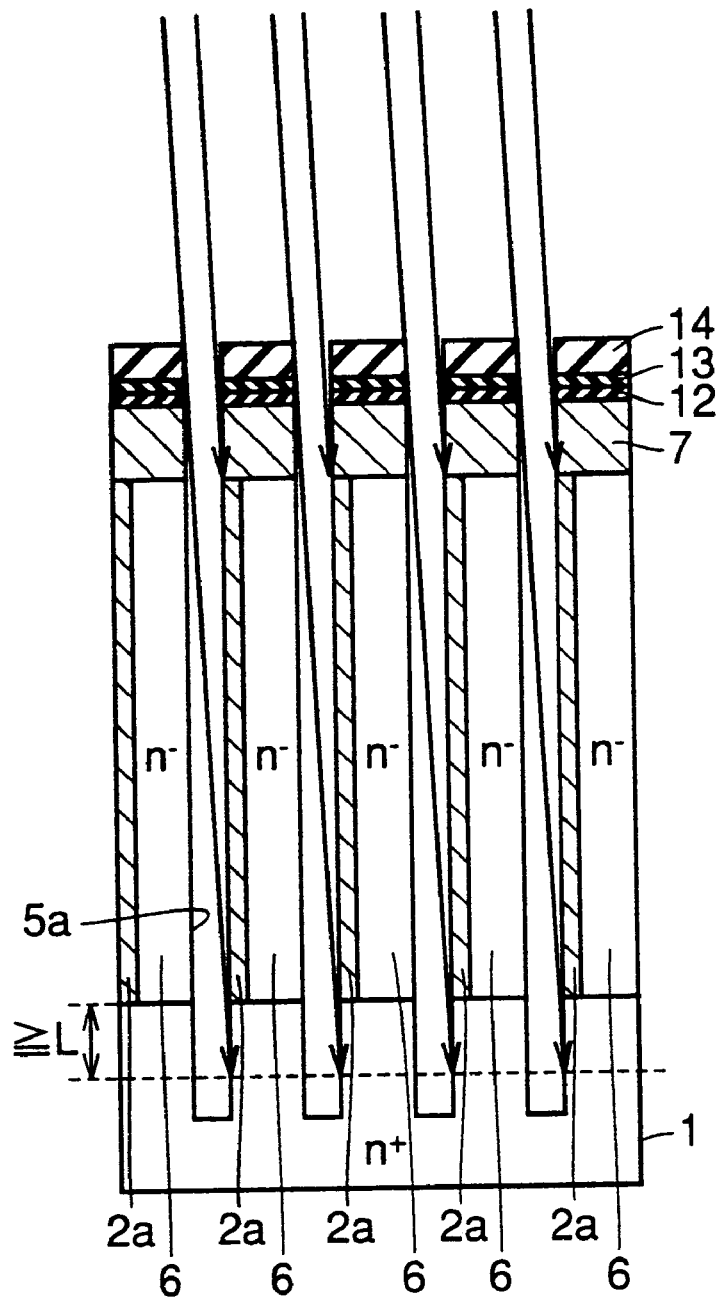
FIGS. 25 and 26 show a location on a trench's sidewall at which a dopant is implanted.
Figure 26:
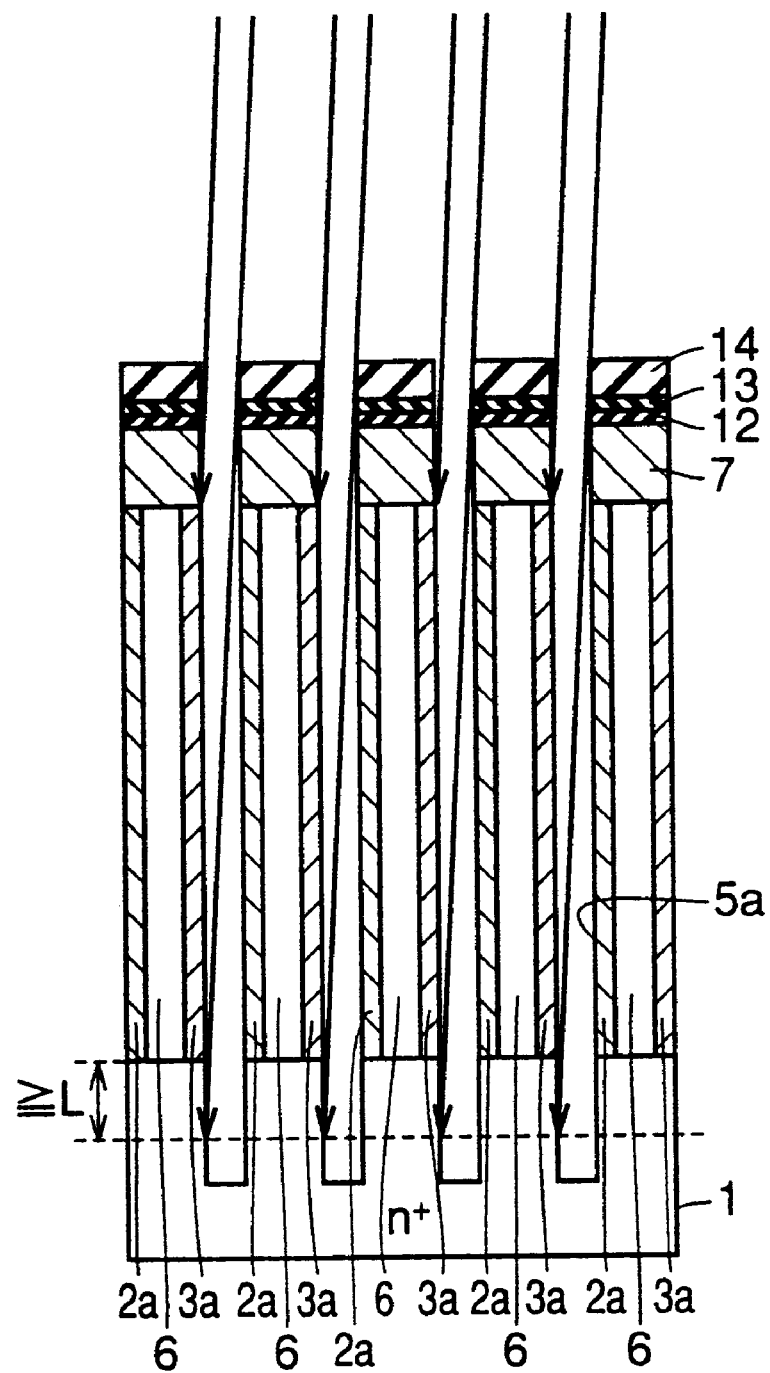

In FIGS. 12 and 13, boron and phosphorus must be implanted at such an angle as described in the third embodiment. More specifically, as shown in FIGS. 25 and 26, the dopants must be implanted at an angle which allows the dopants to be introduced directly into sidewall surfaces deeper than the depth of n⁻doped layer 6 from the first main surface by at least diffusion length L.

In the present embodiment, p and n diffusion regions 2 and 3 can have a uniform concentration that is continuous in a direction perpendicular to the first main surface, and a high withstand voltage and low ON-resistance trench MOSFET can thus be obtained.

Eighth Embodiment

The present embodiment will be described with respect to a planar MOSFET.

Figure 27:
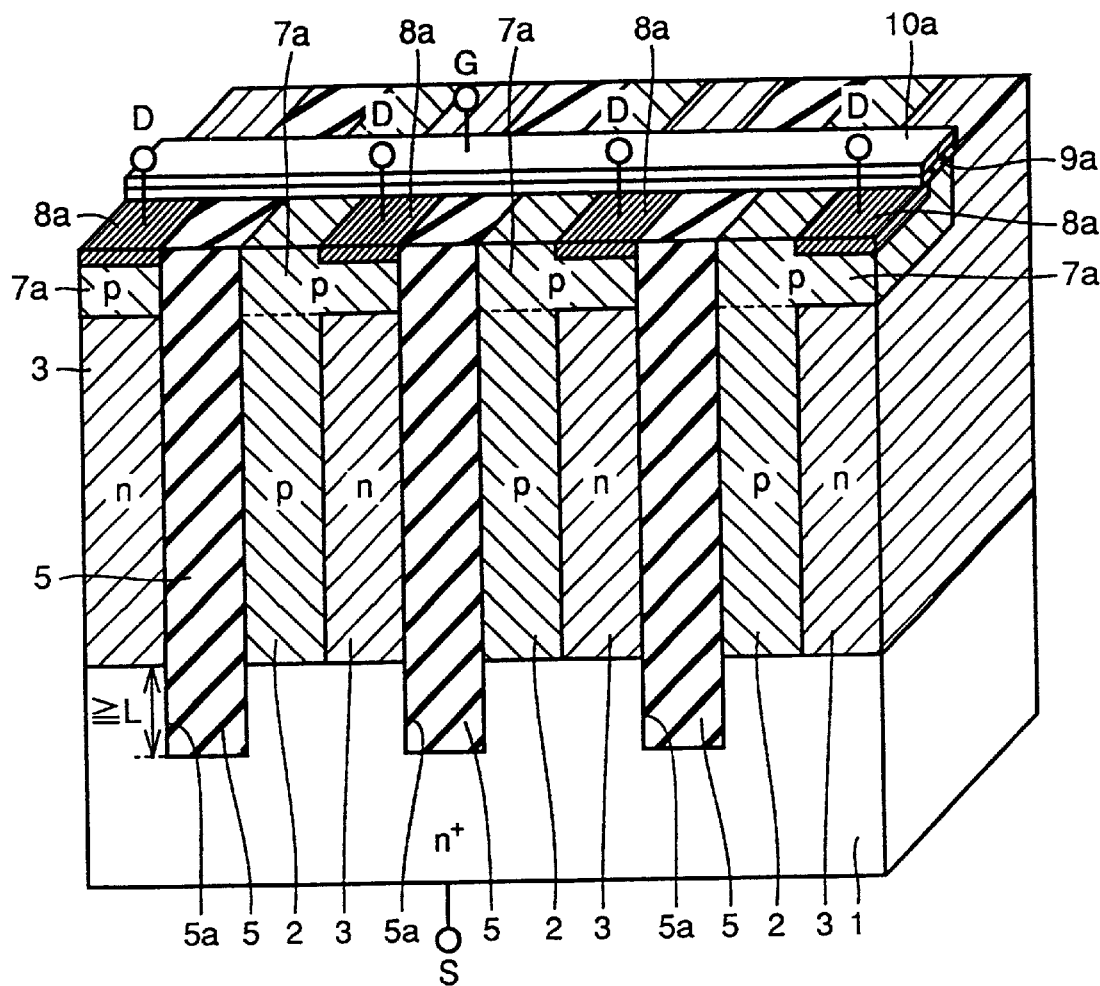
FIG. 27 is a perspective view schematically showing a configuration of a semiconductor device according to an eighth embodiment of the present invention.

Referring to FIG. 27, the planar MOSFET of the present embodiment is distinguished from the FIG. 6 trench MOSFET in the arrangement of p well 7a and source n+diffusion region 8a and the arrangement of gate insulation layer 9a and gate electrode layer 10a. More specifically, p well 7a is located at the first main surface of the semiconductor substrate between source n+diffusion region 8a and n diffusion region 3, and on the first main surface of p well 7a between source n+diffusion region 8a and n diffusion region 3 is provided gate electrode layer 10a with gate insulation layer 9a interposed therebetween.

The remainder of the structure is substantially the same as the FIG. 6 structure and identical members are denoted by same reference characters and a description thereof will not be repeated.

A manufacturing method according to the present embodiment will now be described.

Figure 28:
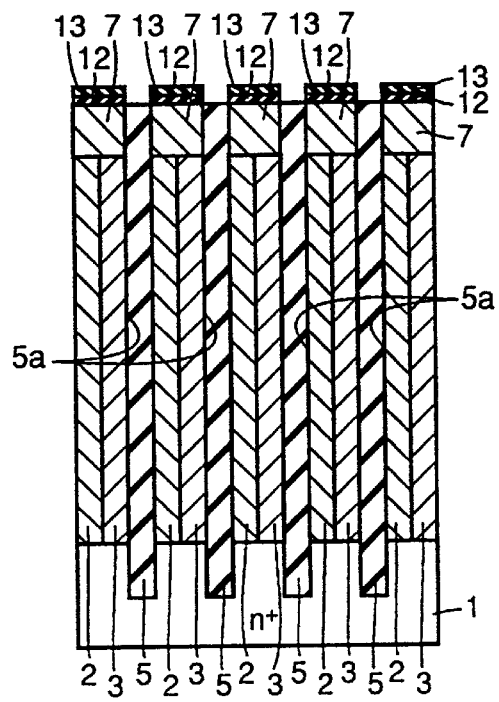
FIG. 28 illustrates a step showing a method of manufacturing a semiconductor device according to the eighth embodiment of the present invention.

The manufacturing method according to the present embodiment initially follows steps substantially the same as the FIGS. 9, 15 steps in the seventh embodiment. Thereafter, filler layer 5 is left only in trench 5a, as shown in FIG. 28, and source n+diffusion region 8a, gate insulation layer 9a and gate electrode layer 10a are then formed, as shown in FIG. 27, to complete a planar MOSFET.

Figure 29:
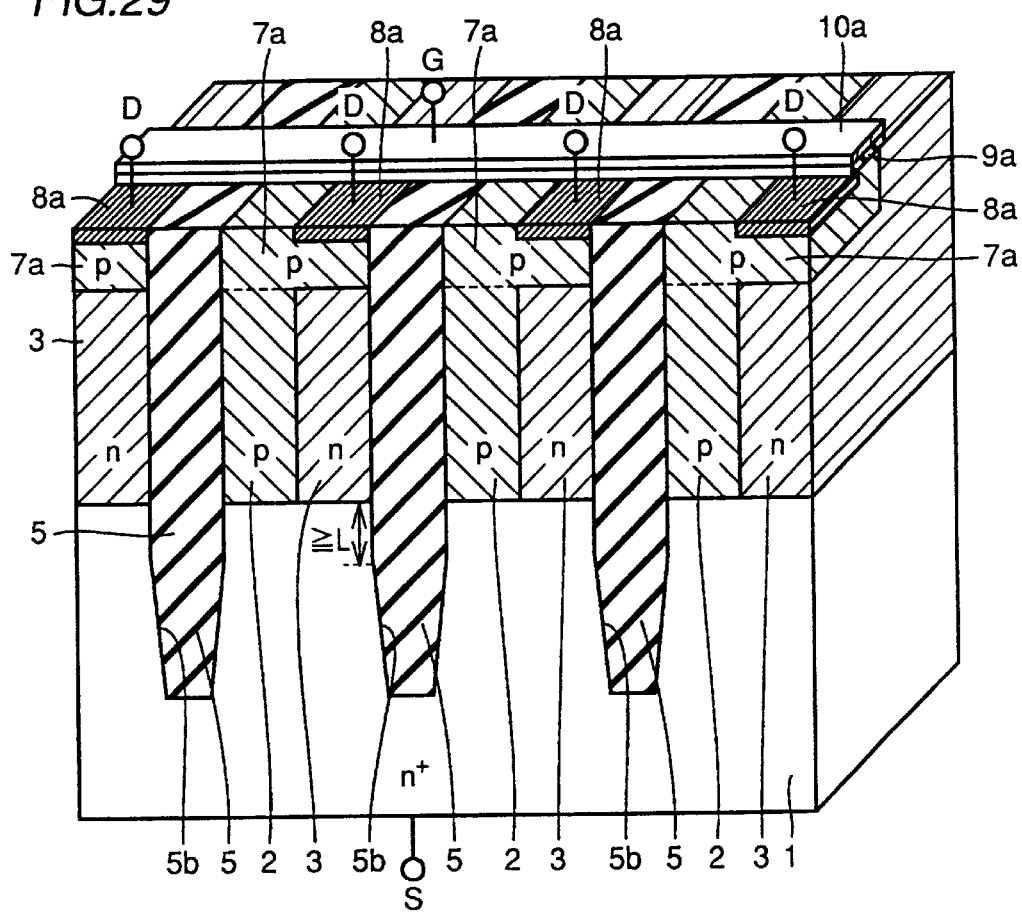
FIG. 29 is a schematic perspective view showing a structure of the semiconductor device according to the eighth embodiment of the present invention with a trench having a tapered bottom.

While trench 5a has a sidewall extending substantially perpendicular to the first main surface, as shown in FIG. 27, it may be alternatively trench 5b, having a sidewall with an inclination varying with its depth, as shown in FIG. 29. It should be noted, however, that the depth at which the trench's sidewall has the varied inclination (i.e., the bottom of the first extending portion) is greater than the depth of p and n diffusion regions 2 and 3 by at least diffusion length L, as has been described in the second embodiment.

The remainder of the structure shown in FIG. 29 is substantially the same as the FIG. 27 structure, so that identical members are denoted by same reference characters and a description thereof will not be repeated.

In the present embodiment, p and n diffusion regions 2 and 3 can have a uniform concentration that is continuous in a direction perpendicular to the first main surface, and a high withstand voltage and low ON-resistance planar MOSFET can thus be obtained.

Ninth Embodiment

The present embodiment will be described with respect to a diode with a p base formed at a substrate surface.

Figure 30:
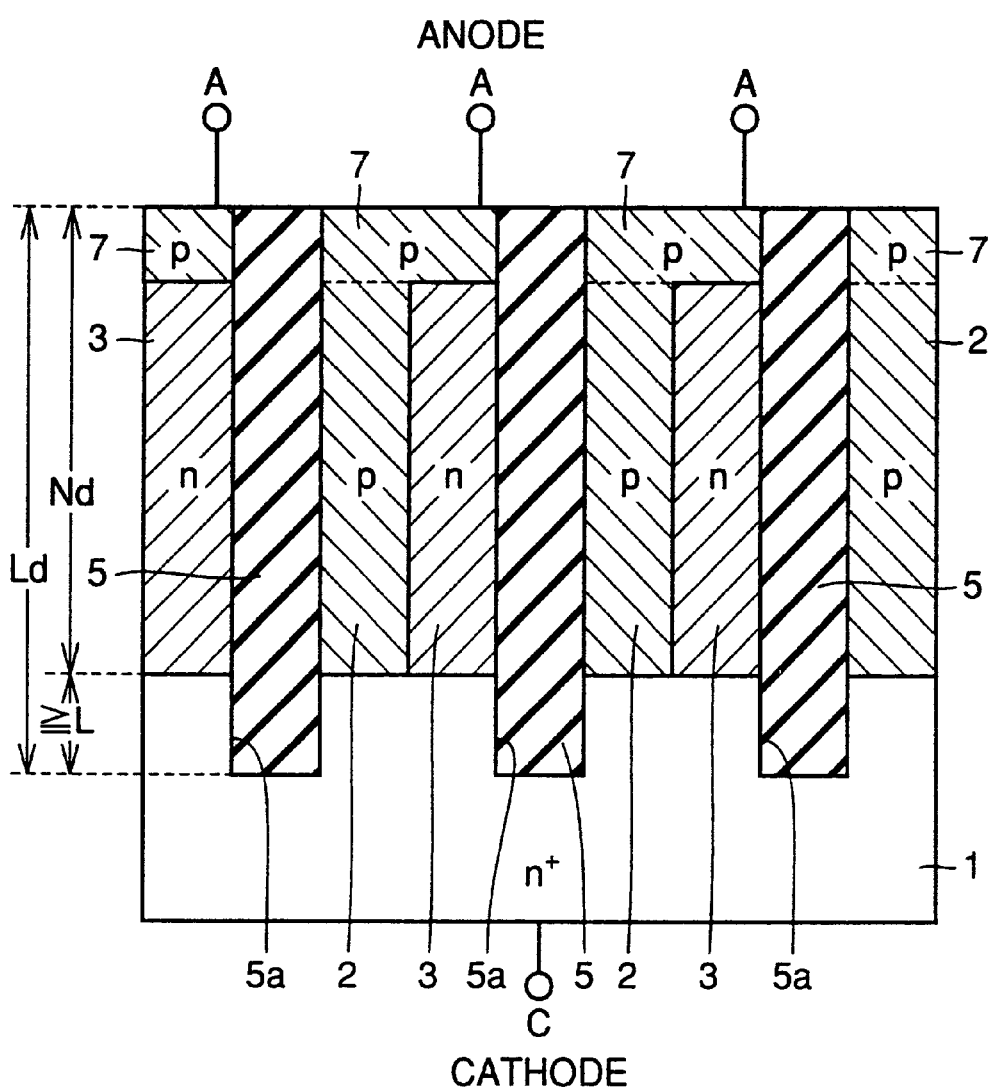
FIG. 30 is a cross section schematically showing a structure of a semiconductor device according to a ninth embodiment of the present invention.

Referring to FIG. 30, a semiconductor substrate has a first main surface with a plurality of trenches 5a provided repeatedly. In a region between trenches 5a are provided p and n diffusion regions 2 and 3, p diffusion region 2 provided at a sidewall surface of one trench 5a, n diffusion region 3 provided at a sidewall surface of the other trench 5a. P and n diffusion regions 2 and 3 form a p-n junction in the direction of the depth of trench 5a.

P base region 7 is formed at the first main surface side of p and n diffusion regions 2 and 3. Trench 5a is filled with filler layer 5 of silicon with a low dopant density (including monocrystalline silicon, polycrystalline silicon, amorphous silicon and microcrystalline silicon), an insulator such as silicon oxide film, or the like. Heavily doped n substrate region 1 is provided adjacent to a p-n repetition structure formed by p and n diffusion regions 2 and 3 and trench 5a and closer to the second main surface than the repetition structure.

P diffusion region 2 has a concentration of a dopant diffused from the sidewall surface of one trench 5a, and n diffusion region 3 has a concentration profile of a dopant diffused from the sidewall surface of the other trench 5a.

A depth Ld of trench 5a from the first main surface is greater than a depth Nd of the p-n repetition structure from the first main surface by at least diffusion length L.

A manufacturing method according to the present embodiment will now be described.

It first follows steps substantially the same as the FIGS. 9–15 steps in the first embodiment, and then follows a structure similar to the FIG. 28 structure in the eighth embodiment. Then, CVD silicon nitride film 13 and thermal oxide film 12 are successively removed to complete the diode shown in FIG. 30.

Figure 31:
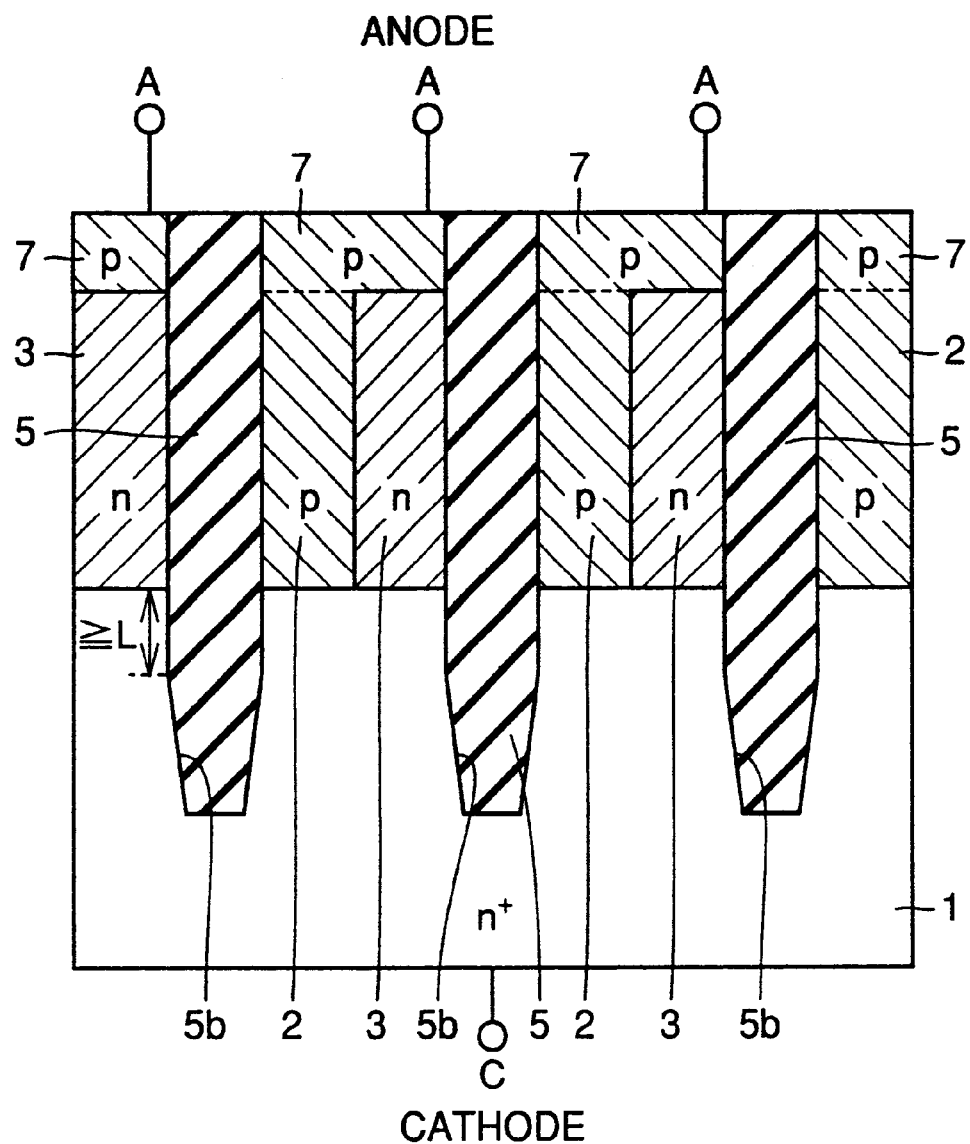
FIG. 31 is a schematic cross section showing a structure of the semiconductor device according to the ninth embodiment of the present invention with a trench having a tapered bottom.

While trench 5a has a sidewall extending substantially perpendicular to the first main surface, as shown in FIG. 30, it may be alternatively trench 5b, having a sidewall with an inclination varying with its depth, as shown in FIG. 31. It should be noted, however, that the depth at which the trench's sidewall has the varied inclination (i.e., the depth of the bottom of the first extending portion) is greater than the depth of p and n diffusion regions 2 and 3 by at least diffusion length L, as has been described in the second embodiment.

The remainder of the FIG. 31 structure is substantially the same as the FIG. 30 structure, and identical members are denoted by same reference characters and a description thereof will not be repeated.

In the present embodiment, p and n diffusion regions 2 and 3 can have a uniform concentration that is continuous in a direction perpendicular to the first main surface and a high withstand voltage and low ON-resistance diode can thus be obtained.

Tenth Embodiment

The present embodiment will be described with respect to a Schottky barrier diode with a Schottky contact formed at a substrate surface.

Figure 32:
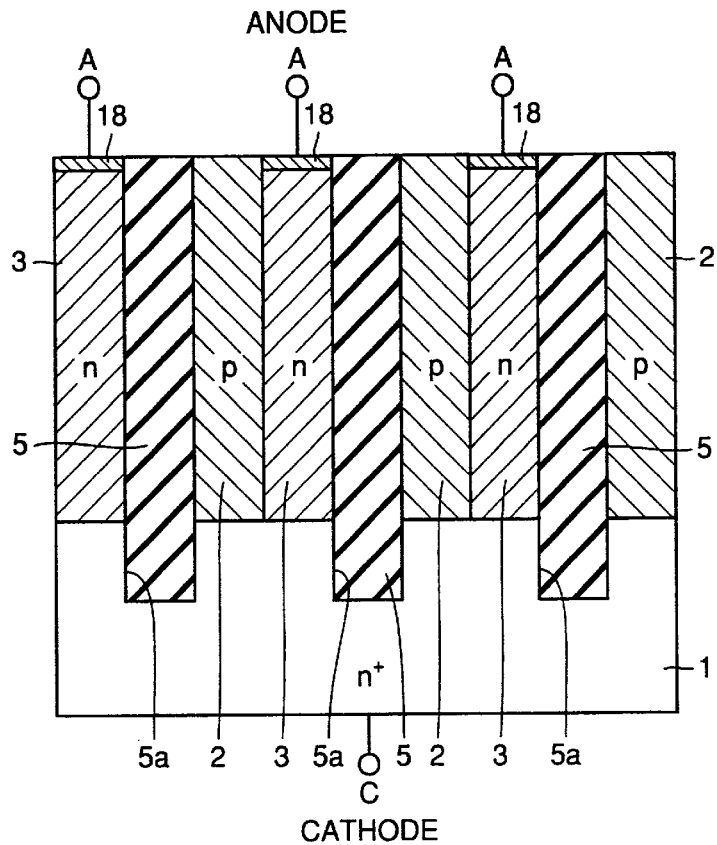
FIG. 32 is a cross section schematically showing a structure of a semiconductor device of a tenth embodiment of the present invention.

Referring to FIG. 32, the present embodiment is distinguished from the FIG. 30 structure in that p base region 7 is replaced by an electrode 18 having a Schottky contact. More specifically, p and n diffusion regions 2 and 3 forming a p-n repetition structure reach the first main surface of the semiconductor substrate, and electrode 18 providing a Schottky contact is formed at n diffusion region 3 on the first main surface.

The remainder of the structure is substantially the same as the FIG. 30 structure, and identical members are denoted by same reference characters and a description thereof will not be repeated.

In manufacturing method according to the present embodiment will now be described.

Figure 33:
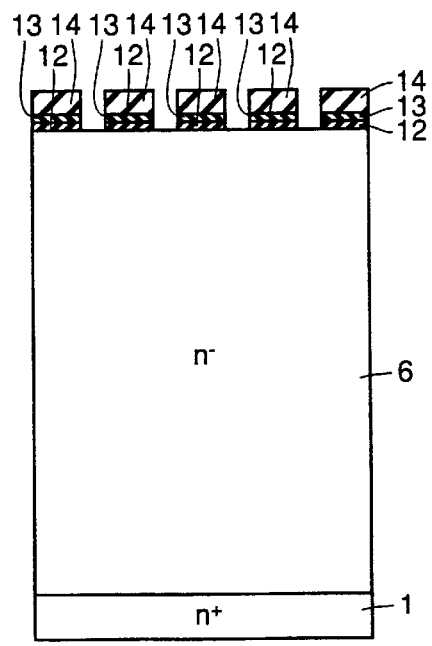
FIGS. 33–36 are schematic cross section illustrating the steps of a method of manufacturing a semiconductor device according to the tenth embodiment of the present invention.

Referring to FIG. 33, heavily doped n substrate region 1 is provided with n⁻doped layer 6 thereon, e.g., through epitaxial growth. Then on the first main surface are provided thermal oxide film 12, CVD silicon nitride film 13 and CVD silicon oxide film 14 providing a 3-layered structure having a desired form. With the structure formed by the stacked layers 12, 13 and 14 used as a mask, the underlying layers are anisotropically etched.

Figure 34:
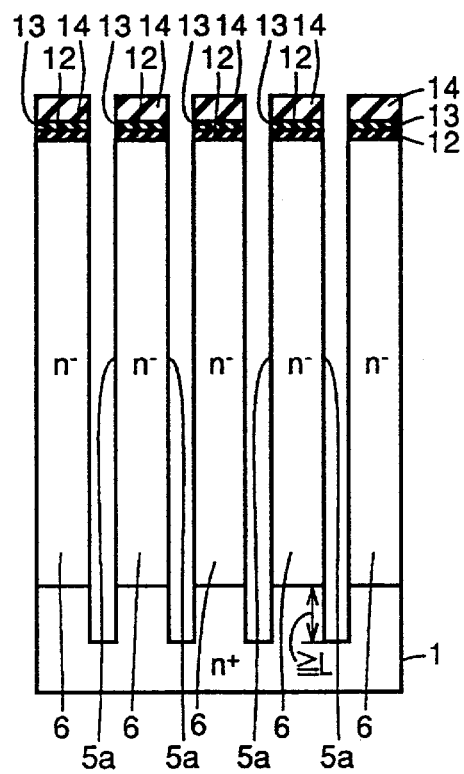

Referring to FIG. 34, the etch penetrates n⁻doped layer 6 to provide trench 5a reaching heavily doped n substrate region 1. The depth of trench 5a from the first main surface is greater than the depth of n⁻doped layer 6 from the first main surface by at least diffusion length L.

Figure 35:
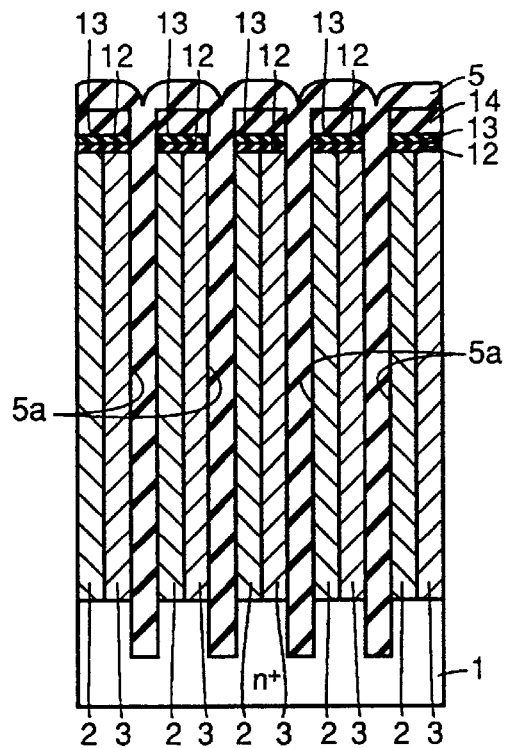
Figure 36:
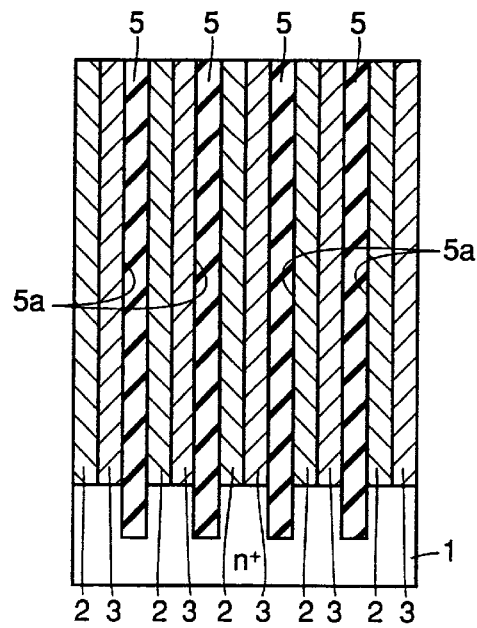

Thereafter, ion implantation and a thermal treatment for dopant diffusion are provided, as shown in FIGS. 12–14, to provide the condition shown in FIG. 35. Then, filler layer 5 except that in trench 5a is removed and CVD silicon oxide film 14 is also removed and then CVD silicon nitride film 13 and thermal oxide film 12 are also successively removed to provide the condition shown in FIG. 36. Then, as shown in FIG. 32, electrode 18 in Schottky contact with n diffusion region 3 is provided on the first main surface to complete a Schottky barrier diode.

Figure 37:
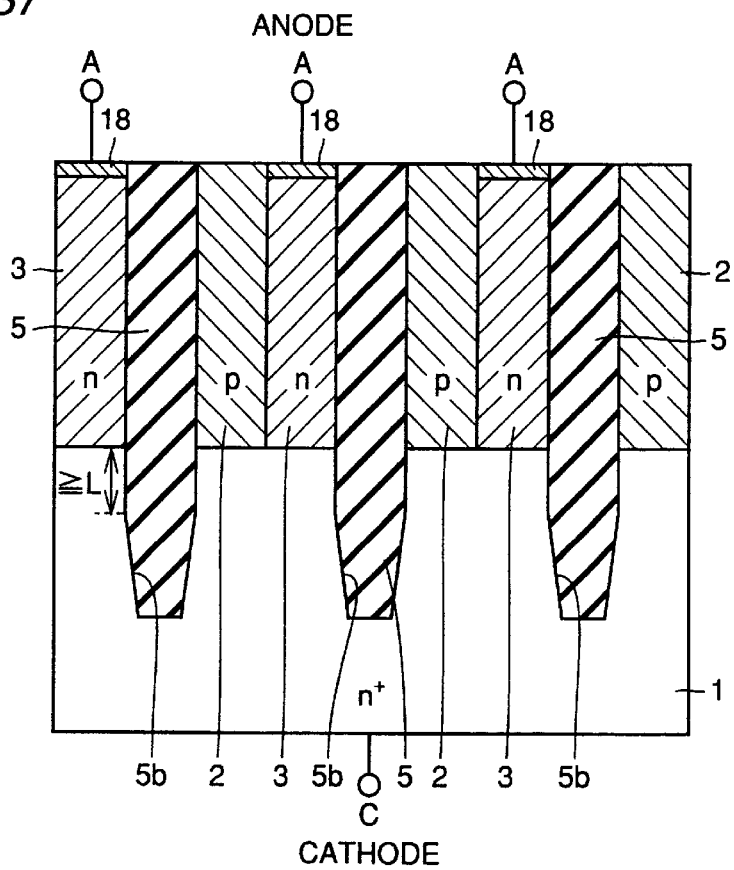
FIG. 37 is a schematic cross section showing a structure of the semiconductor device according to the tenth embodiment of the present invention with a trench having a tapered bottom.
Figure 38:
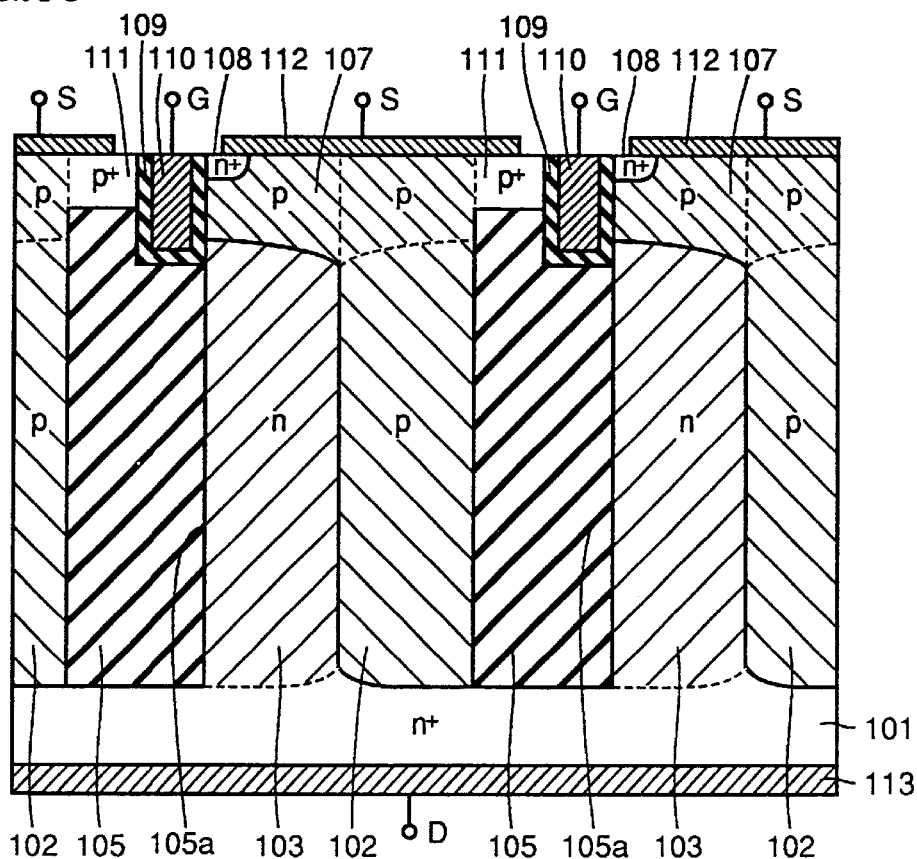
FIG. 38 is a schematic cross section showing a structure of a MOSFET proposed by the Applicant.

While trench 5a has a sidewall extending substantially perpendicular to the first main surface, as shown in FIG. 32, it may be alternatively trench 5b, having a sidewall with an inclination varying with its depth, as shown in FIG. 37. It should be noted, however, that the depth at which the trench's sidewall has the varied inclination (i.e., the depth of the bottom of the first extending portion) is greater than the depth of n diffusion regions 2 and 3 by at least diffusion length L.

The remainder of the structure shown in FIG. 37 is substantially the same as the FIG. 32 structure, and identical members are labeled by same reference characters and a description thereof will not be repeated.

In the present embodiment, p and n diffusion regions 2 and 3 can have a uniform concentration that is continuous in a direction perpendicular to the first main surface, and a high withstand voltage and low ON-resistance Schottky barrier diode can thus be obtained.

Although the present invention has been described and illustrated in detail, it is clearly understood that the same is by way of illustration and example only and is not to be taken by way of limitation, the spirit and scope of the present invention being limited only by the terms of the appended claims.

Industrial Applicability

The present invention is advantageously applicable to a low ON-resistance, low switching-loss, power semiconductor device used for various types of power supply devices, and a method of manufacturing the same.

What is claimed:

1. A semiconductor device comprising:

a semiconductor substrate of a first conductivity type, having first and second main surfaces opposite to each other, said first main surface being provided with a plurality of trenches, a first doped region of the first conductivity type formed in a mesa region of said semiconductor substrate between an adjacent pair of said plurality of trenches at a sidewall surface of one trench of said pair, having a doping concentration profile provided by a dopant of the first conductivity type diffused from the sidewall surface of said one trench, and having a doping concentration lower than that of a region of the first conductivity type of said semiconductor substrate, and a second doped region of a second conductivity type formed in said mesa region at a sidewall surface opposite to the sidewall surface of said one trench, having a doping concentration profile provided by a dopant of the second conductivity type diffused from the sidewall surface opposite to the sidewall surface of said one trench, and forming a p-n junction together with said first doped region, said p-n junction located along the depth direction of said plurality of trenches, said adjacent pair of trenches having a first extending portion extending from said main surface to a first depth position while having a sidewall surface with a predetermined inclination maintained with respect to said first main surface, said first and second doped regions being shallower than said first depth position, as measured from said first main surface, by at least a length of diffusion of said dopants of the first and second conductivity types in manufacturing the semiconductor device.

2. The semiconductor device according to claim 1, wherein said adjacent pair of trenches each also have a second extending portion tapering toward said second main surface, said second extending portion extending deeper than said first depth position towards said second main surface to a second depth position and having a sidewall surface with an inclination different from that of said first extending portion.

3. The semiconductor device according to claim 1, further comprising:
a third doped region of the second conductivity type formed at said first main surface side of said first and second doped regions and electrically connected to said second doped region;
a fourth doped region of the first conductivity type formed at at least one of said first main surface or a sidewall surface of said one trench such that said fourth doped region is opposite to said first doped region with said third doped region posed therebetween; and
a gate electrode layer opposite to said third doped region between said first and fourth doped regions, with a gate insulation layer interposed therebetween.

4. The semiconductor device according to claim 3, wherein said gate electrode layer is provided in at least of said trenches.

5. The semiconductor device according to claim 3, wherein said gate electrode layer is formed on said first main surface.

6. The semiconductor device according to claim 1, further comprising a third doped region of the second conductivity type formed at said first main surface side of said first and second dope regions and electrically connected to said second doped region.

7. The semiconductor device according to claim 1, further comprising an electrode layer in Schottky contact with said first doped region.

8. The semiconductor device according to claim 1, wherein a diffusion length of each of said dopants of the first and second conductivity types in manufacturing the semiconductor device is longer than a distance from the sidewall surfaces of said adjacent pair of trenches to said p-n junction of said first and second doped regions.

9. A method of manufacturing a semiconductor device comprising the steps of:
providing a semiconductor substrate having first and second main surfaces opposite to each other, said semiconductor substrate having a heavily doped region of a first conductivity type at said second main surface and having a lightly doped region of the first conductivity type at said first main surface side,
providing in said semiconductor substrate a plurality of trenches having a first extending portion extending from said first main surface into said heavily doped region to a first depth position while having a sidewall surface with a predetermined inclination maintained relative to said first main surface,
obliquely implanting a dopant of the first conductivity type in a mesa region of said semiconductor substrate between an adjacent pair of said plurality of trenches at a sidewall surface of one trench, to form at the sidewall surface of said one trench a first doped region of the first conductivity type having a doping concentration lower than that of said heavily doped region, and
obliquely implanting a dopant of the second conductivity type in said mesa region at a sidewall surface opposite to the sidewall implanted with said dopant of the first conductivity type, to provide a second doped region of the second conductivity type at the sidewall surface opposite to the sidewall implanted with said dopant of the first conductivity type, to provide a p-n junction of the first and second doped regions located along the depth direction of said plurality of trenches,
said first depth position being closer to said second main surface than a junction of said heavily and lightly doped regions to said second main surface by at least a diffusion length of each of said dopants of the first and second conductivity types in manufacturing the semiconductor device,
said dopants of the first and second conductivity types being each implanted at an angle allowing each of said dopants of the first and second conductivity types to be directly introduced into a sidewall surface of said treches located at a depth closer to said second main surface than said junction of said heavily and lightly doped regions to said second main surface by at least said diffusion length of each of said dopants of the first and second conductivity types in manufacturing the semiconductor device.

10. The method according to claim 9, wherein said plurality of trenches each have a second extending portion tapering toward said second main surface, said second extending portion extending deeper than said first depth position towards said second main surface to a second depth position while having a sidewall surface with an inclination different from that of said first extending portion.

11. The method according to claim 9, further comprising:
providing a third doped region of the second conductivity type at said first main surface side of said first and second doped regions to be electrically connected to said second doped region;
providing a fourth doped region of the first conductivity type at at least one of said first main surface or a sidewall surface of said one trench such that said fourth doped region is opposite to said first doped region with said third doped region posed therebetween; and
providing a gate electrode layer opposite to said third doped region between said first and fourth doped regions, with a gate insulation layer interposed therebetween.

12. The method according to claim 11, wherein said gate electrode layer is formed in at least one of said trenches.

13. The method according to claim 11, wherein said gate electrode layer is formed on said first main surface.

14. The method according to claim 9, further comprising the step of providing a third doped region of the second conductivity type at said first main surface side of said first and second doped regions to be electrically connected to said second doped region.

15. The method according to claim 9, further comprising the step of providing an electrode layer in Schottky contact with said first doped region.

16. The method according to claim 9, wherein a diffusion length of each of said dopants of the fast and second conductivity types in manufacturing the semiconductor device is longer than a distance from the sidewall surfaces of said adjacent pair of trenches to said p-n junction of said first and second doped regions.

* * * * *